US012787493B2

(12) United States Patent
Templier

(10) Patent No.: US 12,787,493 B2
(45) Date of Patent: Nov. 3, 2026

(54) OPTOELECTRONIC DEVICE INCLUDING ACTIVE PHOTOSENSITIVE SEMICONDUCTOR LAYER TOTALLY FILLING ALL FREE SPACES LATERALLY EXTENDING BETWEEN INORGANIC LIGHT-EMITTING DIODES AND MANUFACTURING METHOD THEREFOR

(71) Applicant: Commissariat à l'Énergie Atomique et aux Énergies Alternatives, Paris (FR)

(72) Inventor: François Templier, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 913 days.

(21) Appl. No.: 17/898,528

(22) Filed: Aug. 30, 2022

(65) Prior Publication Data

US 2023/0064995 A1 Mar. 2, 2023

(30) Foreign Application Priority Data

Sep. 1, 2021 (FR) ....................................... 2109136

(51) Int. Cl.
*H10H 20/01* (2025.01)
*H10H 20/857* (2025.01)
*H10W 90/00* (2026.01)

(52) U.S. Cl.
CPC ........ *H10H 20/018* (2025.01); *H10H 20/857* (2025.01); *H10W 90/00* (2026.01)

(58) Field of Classification Search
CPC ............... H10H 20/018; H10H 20/857; H10H 20/0364; H10H 20/019; H10H 20/021; H01L 25/0753; H01L 25/167; H10K 39/32; H10K 30/35
See application file for complete search history.

(56) References Cited

U.S. PATENT DOCUMENTS

2017/0186908 A1 6/2017 Robin et al.
2018/0308998 A1* 10/2018 Swelm .................. H10F 77/206
2018/0366450 A1 12/2018 Gardner et al.
(Continued)

FOREIGN PATENT DOCUMENTS

CN 111564465 A 8/2020
DE 10 2006 049 120 A1 4/2008

OTHER PUBLICATIONS

Cok, R. S., et al. (2017), Inorganic light-emitting diode displays using micro-transfer printing, Jnl Soc Info Display, 25: 589-609, doi: 10.1002/jsid.610. (Year: 2017).*
(Continued)

*Primary Examiner* — Davienne N Monbleau
*Assistant Examiner* — John Patrick Cornely
(74) *Attorney, Agent, or Firm* — Wolf, Greenfield & Sacks, P.C.

(57) ABSTRACT

A method of manufacturing an optoelectronic device including the following successive steps: a) forming, on an integrated control circuit previously formed inside and on top of a semiconductor substrate, a plurality of inorganic light-emitting diodes; and b) depositing an active photosensitive semiconductor layer to fill free spaces laterally extending between the inorganic light-emitting diodes.

15 Claims, 16 Drawing Sheets

(56) References Cited

U.S. PATENT DOCUMENTS

| | | | | |
|---|---|---|---|---|
| 2019/0131343 | A1* | 5/2019 | Templier .............. | H10H 20/018 |
| 2021/0118954 | A1* | 4/2021 | Bailly ..................... | H10K 30/88 |
| 2021/0125971 | A1 | 4/2021 | Chu et al. | |
| 2022/0165971 | A1* | 5/2022 | Koide ................... | H10F 39/011 |

OTHER PUBLICATIONS

Preliminary Search Report for French Application No. 2109136, dated May 17, 2022.

* cited by examiner

OPTOELECTRONIC DEVICE INCLUDING ACTIVE PHOTOSENSITIVE SEMICONDUCTOR LAYER TOTALLY FILLING ALL FREE SPACES LATERALLY EXTENDING BETWEEN INORGANIC LIGHT-EMITTING DIODES AND MANUFACTURING METHOD THEREFOR

CROSS-REFERENCE TO RELATED APPLICATION

The present patent application claims the priority benefit of French patent application 21/09136, filed Sep. 1, 2021. The contents of which is incorporated herein by reference in its entirety.

TECHNICAL BACKGROUND

The present disclosure generally concerns the field of optoelectronic devices, and more particularly aims at a method of manufacturing an optoelectronic device combining a light emission function and an optical capture function.

PRIOR ART

Various applications are likely to benefit from an optoelectronic device combining a light emission function and an optical capture function. Such a device may for example be used to form an interactive display screen.

SUMMARY

An object of an embodiment is to overcome all or part of the disadvantages of known solutions for forming an optoelectronic device combining a light emission function and an optical capture function.

For this purpose, an embodiment provides a method of manufacturing an optoelectronic device, comprising the successive steps of:

a) forming, on an integrated control circuit previously formed inside and on top of a semiconductor substrate, a plurality of inorganic light-emitting diodes; and b) depositing an active photosensitive semiconductor layer to fill free spaces laterally extending between the inorganic light-emitting diodes.

According to an embodiment, the method comprises the forming of a plurality of photosensitive diodes in the active photosensitive semiconductor layer.

According to an embodiment, the method comprises, after step a) and before step b), a step of forming of electrodes of the photosensitive diodes between the inorganic light-emitting diodes.

According to an embodiment, the active photosensitive semiconductor layer comprises at least one polymer material.

According to an embodiment, the active photosensitive semiconductor layer comprises quantum dots.

According to an embodiment, the active photosensitive semiconductor layer is an organic semiconductor layer.

According to an embodiment, the active photosensitive semiconductor layer is deposited by liquid deposition between the inorganic light-emitting diodes.

According to an embodiment, step a) comprises a step of transfer of an active inorganic light-emitting diode stack onto the integrated control circuit, and then a step of etching of trenches in the active inorganic light-emitting diode stack, to laterally separate the inorganic light-emitting diodes from one another.

According to an embodiment, the method further comprises, after step a) and before step b), a step of anisotropic deposition of a conductive layer on top of and between the inorganic light-emitting diodes.

According to an embodiment, step a) comprises a step of transfer, onto the integrated control circuit, of a structure comprising, on a support substrate, the inorganic light-emitting diodes and, between the inorganic light-emitting diodes, a stack comprising, from the support substrate, a first conductive layer, a second insulating layer, and a second conductive layer, the second conductive layer being flush with a surface of the inorganic light-emitting diodes opposite to the support substrate.

According to an embodiment, the method further comprises, after the transfer step, a step of removal of the support substrate and then a step of etching of the second conductive layer, wherein the insulating layer is used as an etch stop layer.

According to an embodiment, the method comprises, after step b), a step of bonding of a temporary support substrate on the side of a surface the device opposite to the integrated circuit, followed by a step of cutting of the assembly comprising the integrated circuit, the active photosensitive semiconductor layer, and the organic light-emitting diodes into a plurality of elementary chips.

According to an embodiment, the method further comprises a step of transfer and of bonding of said elementary chips onto a transfer substrate of the device, and then a step of removal of the temporary support substrate.

An embodiment provides an optoelectronic device comprising:

- an integrated control circuit formed inside and on top of a semiconductor substrate;
- a plurality of inorganic light-emitting diodes arranged on a surface of the integrated control circuit; and
- an active photosensitive semiconductor layer laterally extending between the light-emitting diodes.

An embodiment provides an optoelectronic device comprising a transfer substrate, and a plurality of elementary chips bonded and electrically connected to the transfer substrate, each elementary chip comprising a device such as previously described, the integrated control circuit being arranged on the side of the transfer substrate.

BRIEF DESCRIPTION OF THE DRAWINGS

The foregoing and other features and advantages of the present invention will be discussed in detail in the following non-limiting description of specific embodiments in connection with the accompanying drawing, in which.

DESCRIPTION OF THE EMBODIMENTS

Figure 1A:
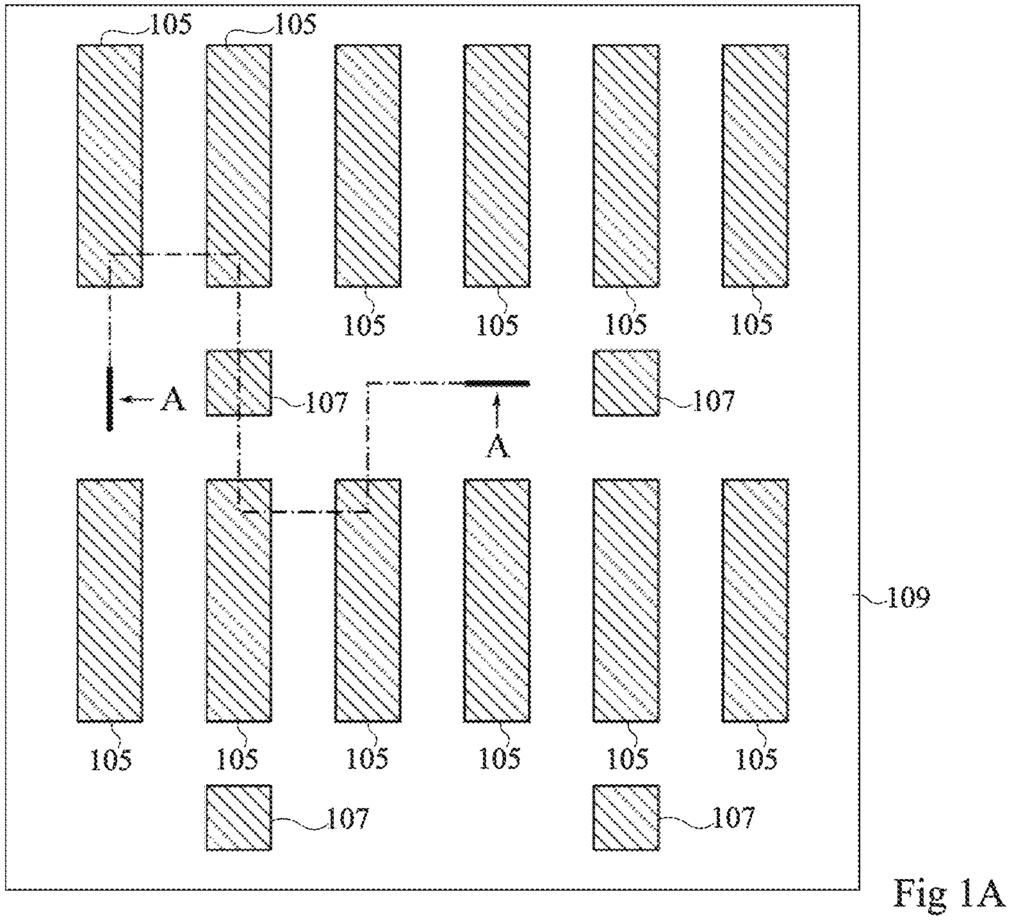
FIGS. 1A, 1B, 1C, 1D, 1E, 1F, 1G, 1H, 1I, 1J, 1K, 1L, 1M, 1N, 1O, 1P, 1Q, 1R, 1S, and 1T are partial simplified views illustrating successive steps of an example of an optoelectronic device manufacturing method according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the photosensitive diodes, or photodetectors, of the light-emitting diodes (LED), and of the integrated control circuits of the described devices has not been detailed, the detailed implementation of these elements being within the abilities of those skilled in the art based on the functional indications of the present description. Further, the various applications capable of implementing the described devices have not been detailed, the described embodiments being compatible with all or most of the applications likely to benefit from a device combining a light emission function and an optical capture function (photodetection).

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

The term "transmittance of a layer" designates the ratio of the intensity of the radiation coming out of the layer to the intensity of the radiation entering the layer. In the following description, a layer or a film is called opaque to a radiation when the transmittance of the radiation through the layer or the film is smaller than 10%. In the following description, a layer or a film is called transparent to a radiation when the transmittance of the radiation through the layer or the film is greater than 10%.

In the following description, "visible light" designates an electromagnetic radiation having a wavelength in the range from 400 nm to 700 nm and "infrared radiation" designates an electromagnetic radiation having a wavelength in the range from 700 nm to 1 mm. In infrared radiation, one can in particular distinguish near infrared radiation having a wavelength in the range from 700 nm to 1.7 μm.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred unless otherwise specified to the orientation of the corresponding drawings.

Unless specified otherwise, the terms "about", "approximately", "substantially", and "in the order of" signify within 10%, preferably within 5%.

According to an aspect of an embodiment, it is provided, to form an optoelectronic device combining a light emission function and a photodetection function, a method comprising the steps of forming, on an integrated control circuit previously formed inside and on top of a semiconductor substrate, a plurality of inorganic light-emitting diodes (LEDs), and then to deposit an active semiconductor layer in order to fill spaces between the light-emitting diodes. The method further comprises steps enabling to define a plurality of photosensitive diodes, or photodetectors, in the active semiconductor layer.

Figure 1B:
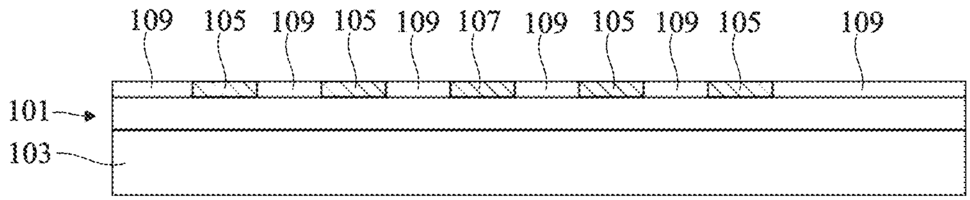
Figure 1C:
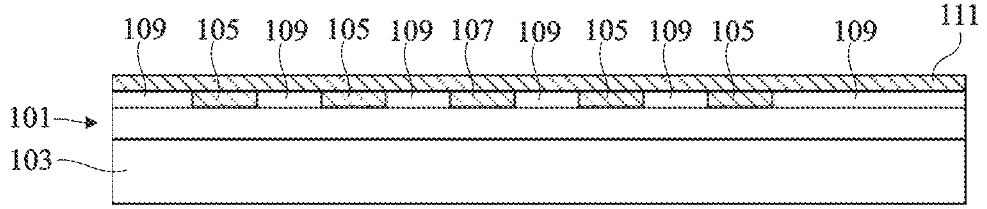
Figure 1D:
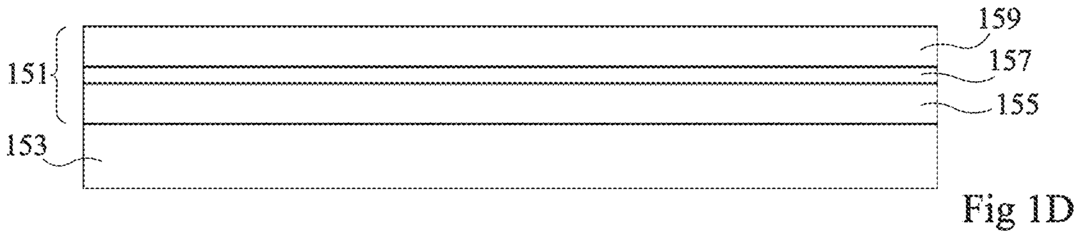
Figure 1E:
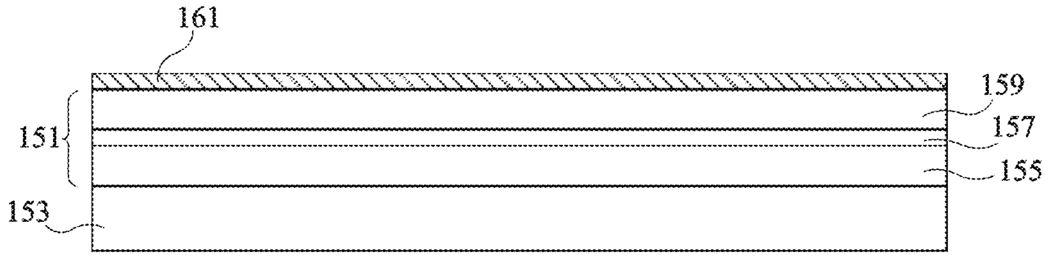
Figure 1F:
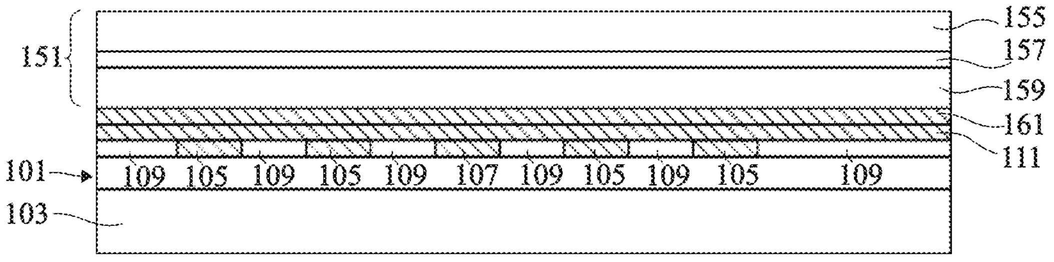
Figure 1G:
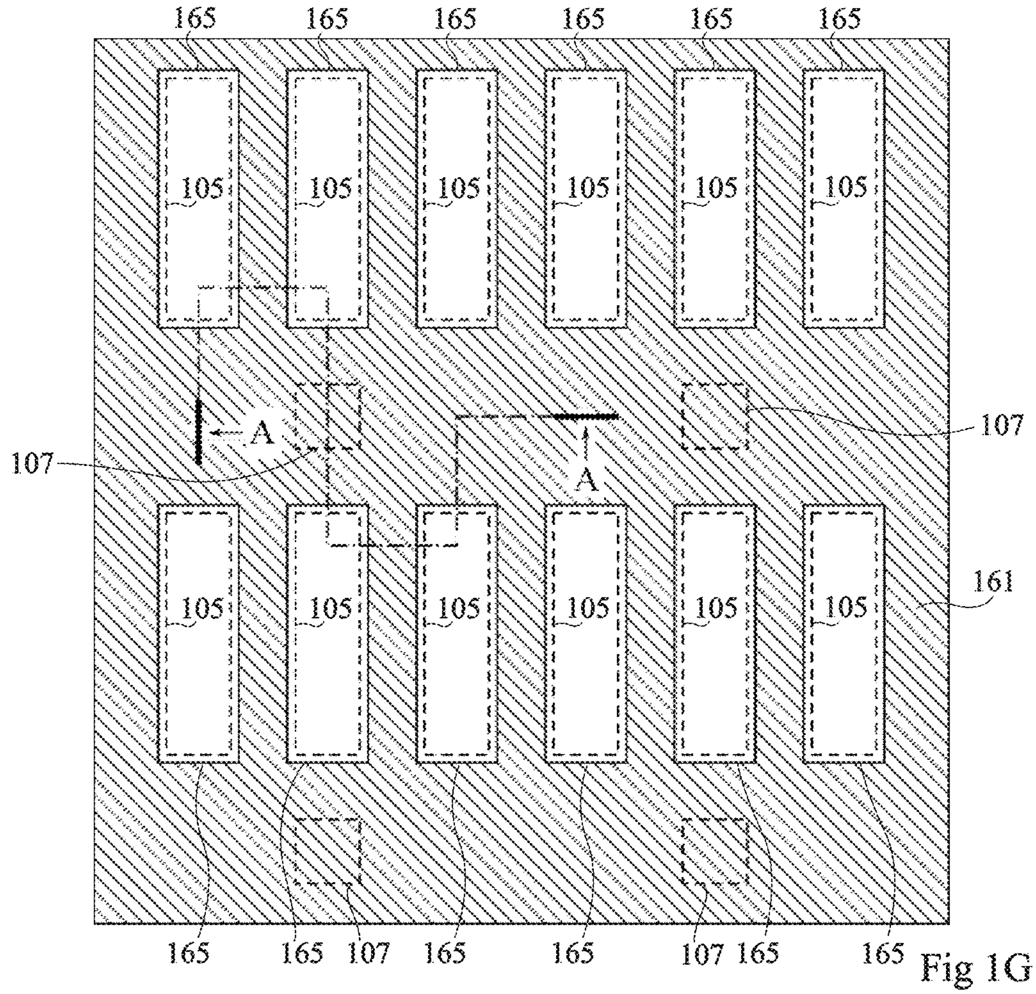
Figure 1H:
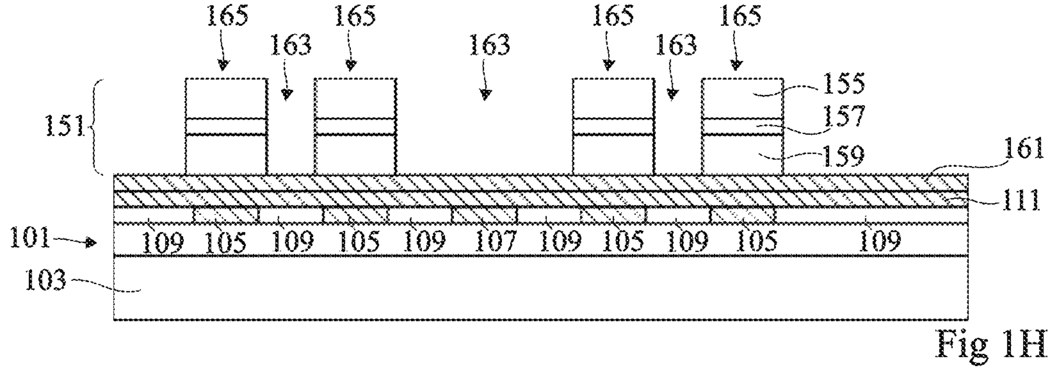
Figure 1I:
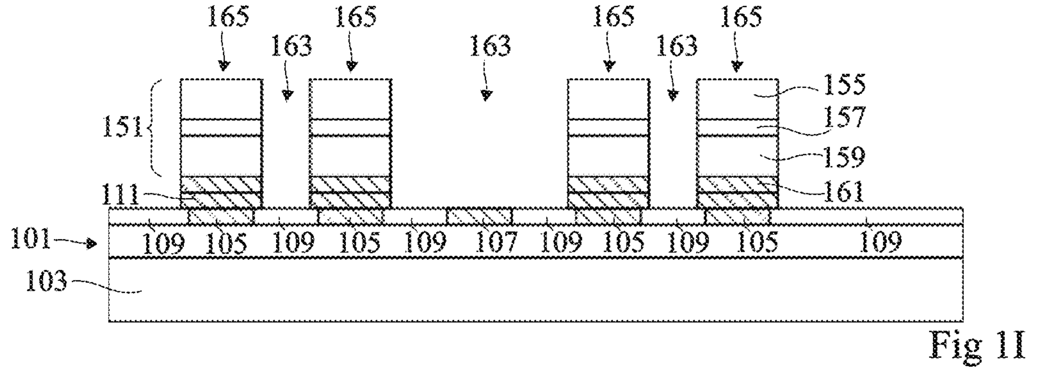
Figure 1J:
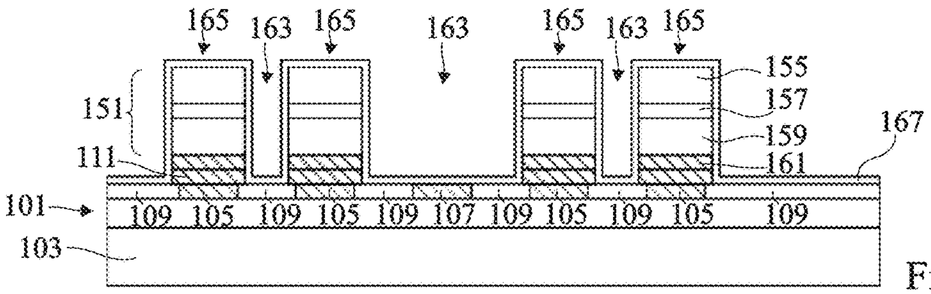
Figure 1K:
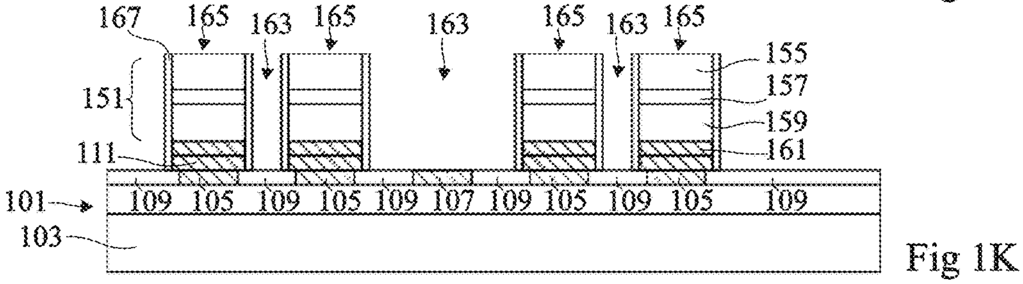
Figure 1L:
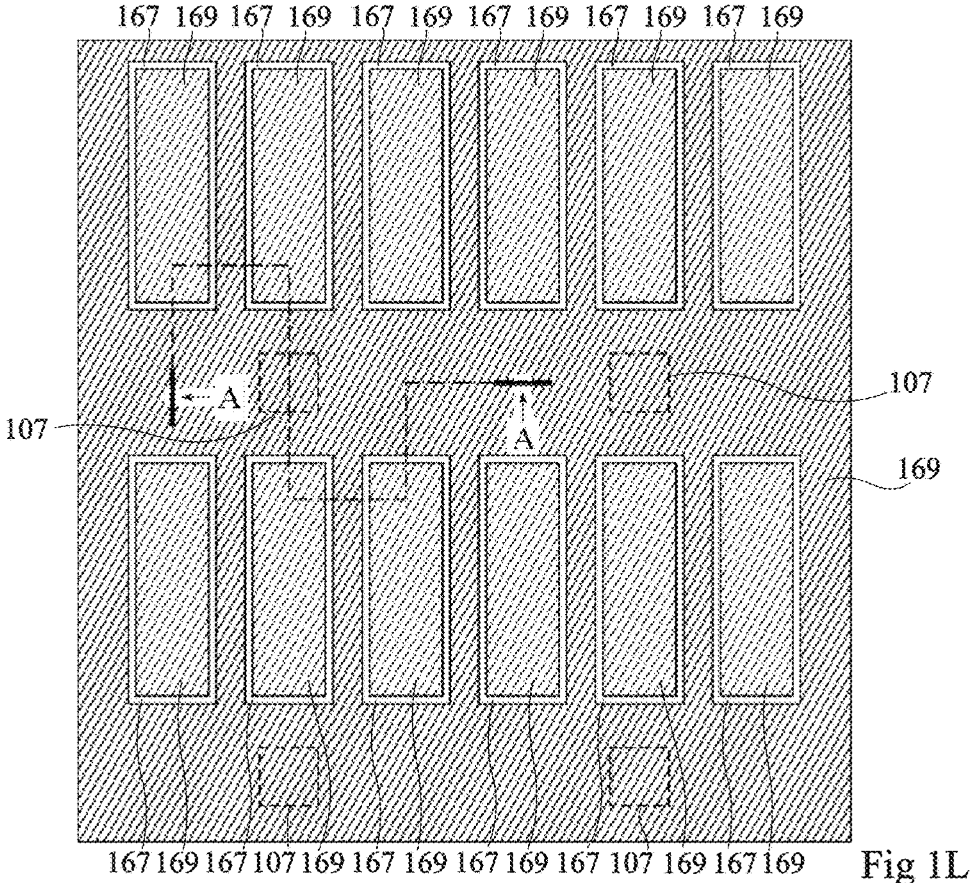
Figure 1M:
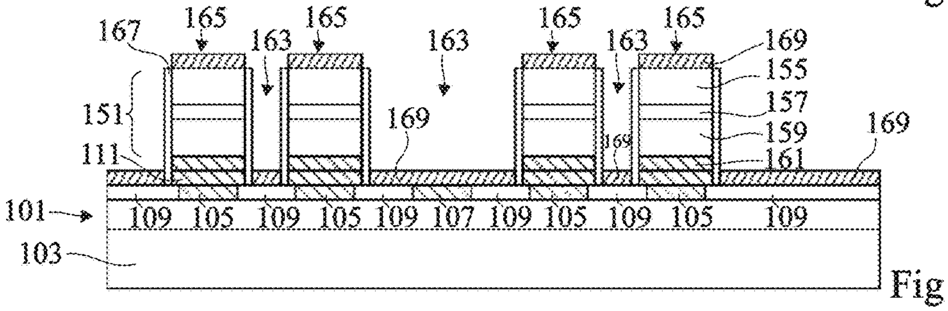
Figure 1N:
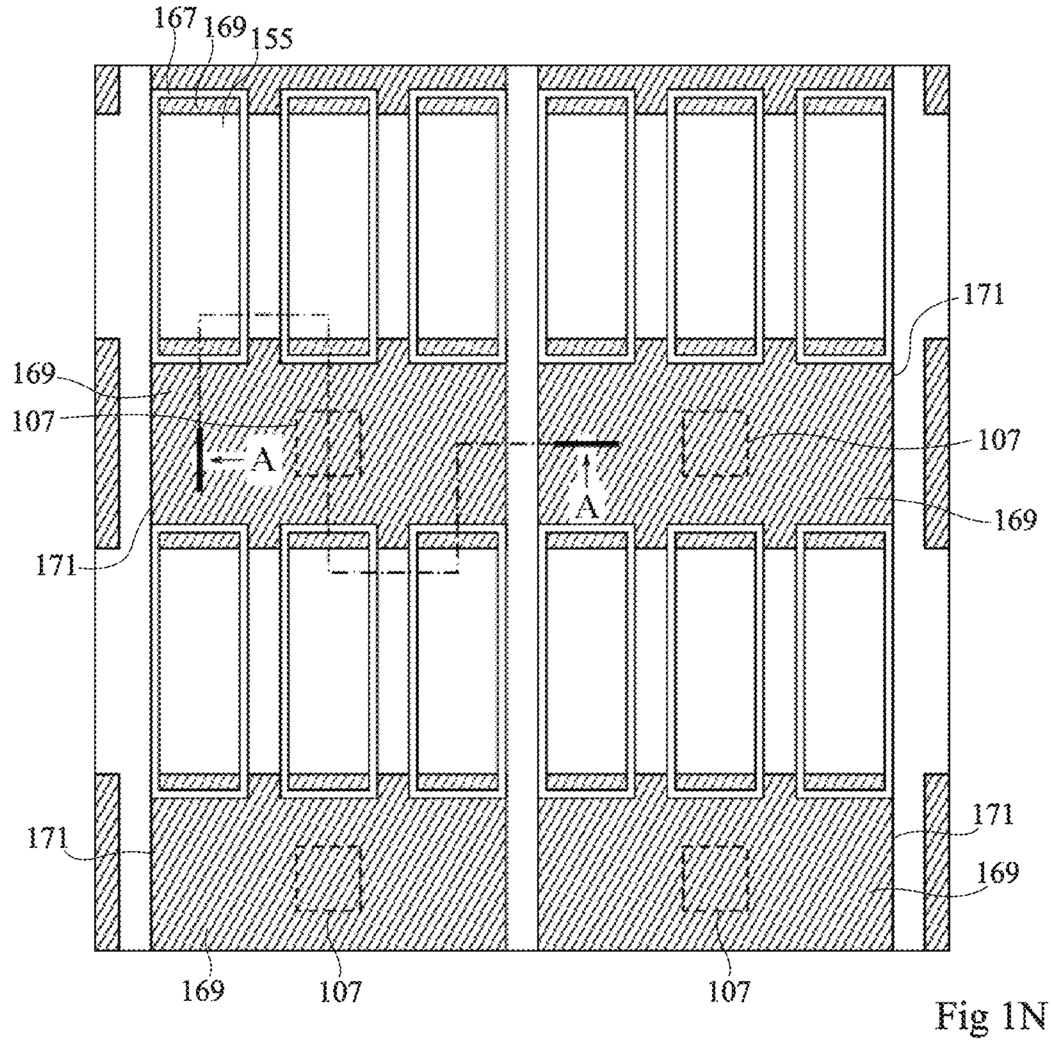
Figure 1O:
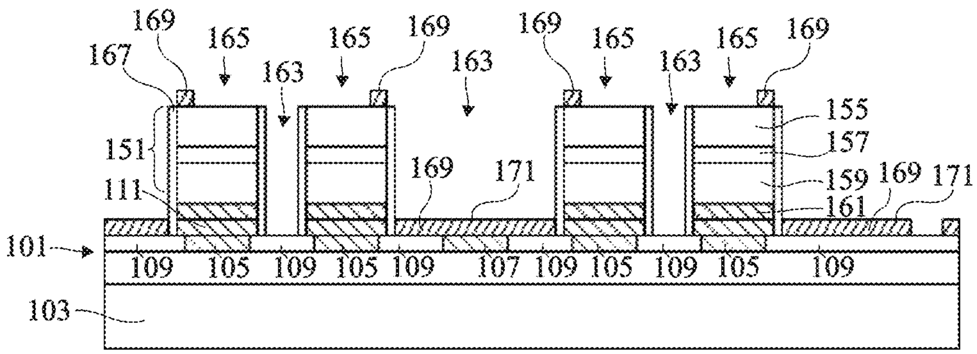
Figure 1P:
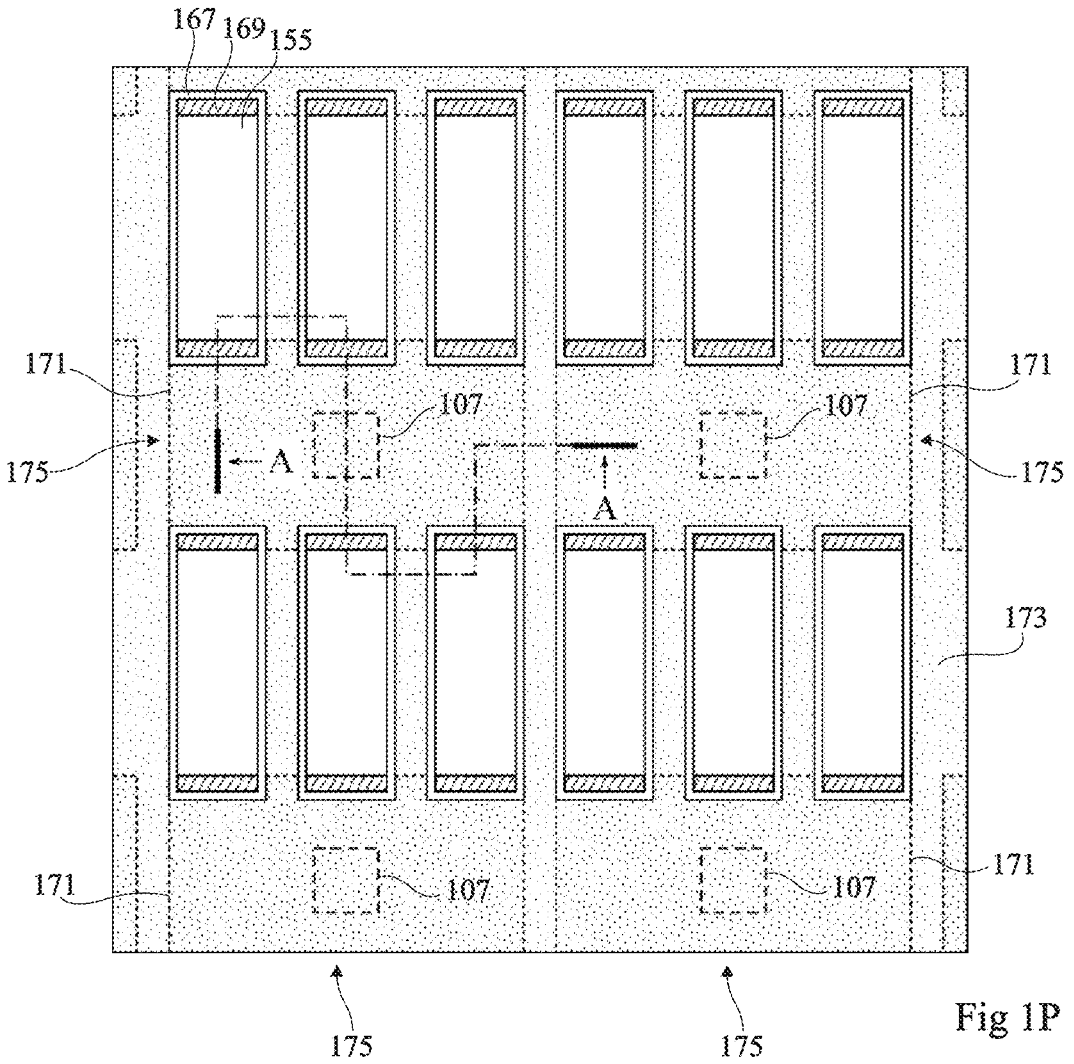
Figure 1Q:
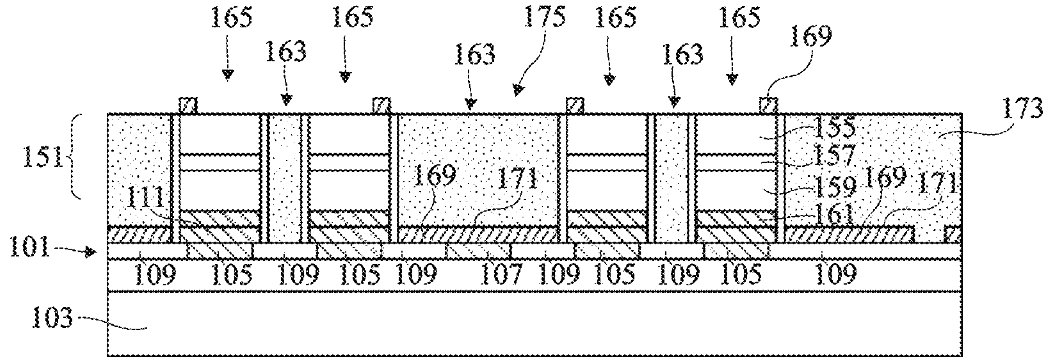
Figure 1R:
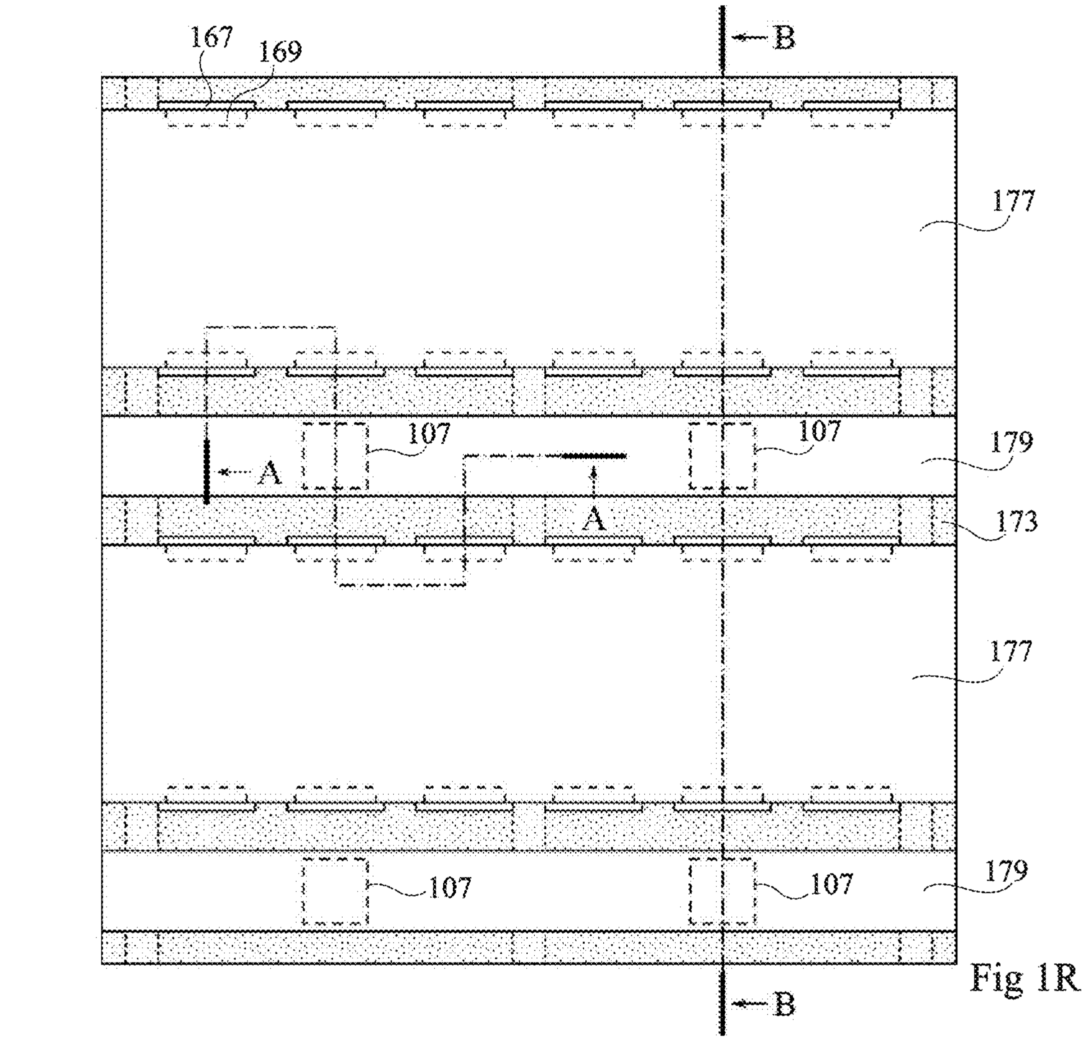
Figure 1S:
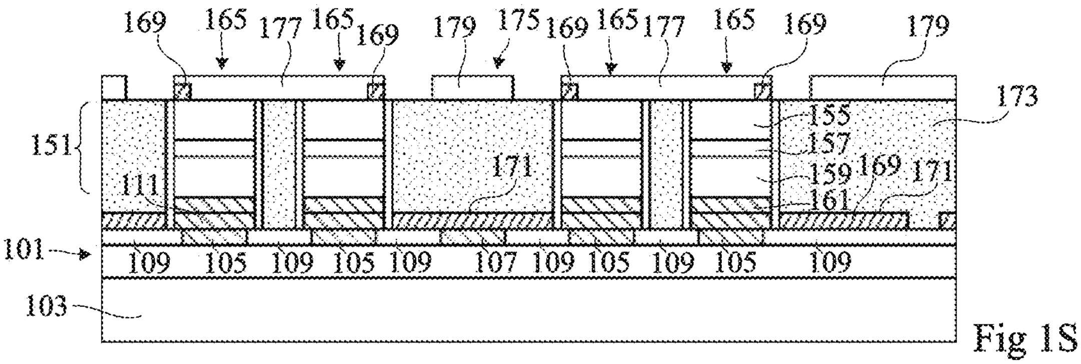
Figure 1T:
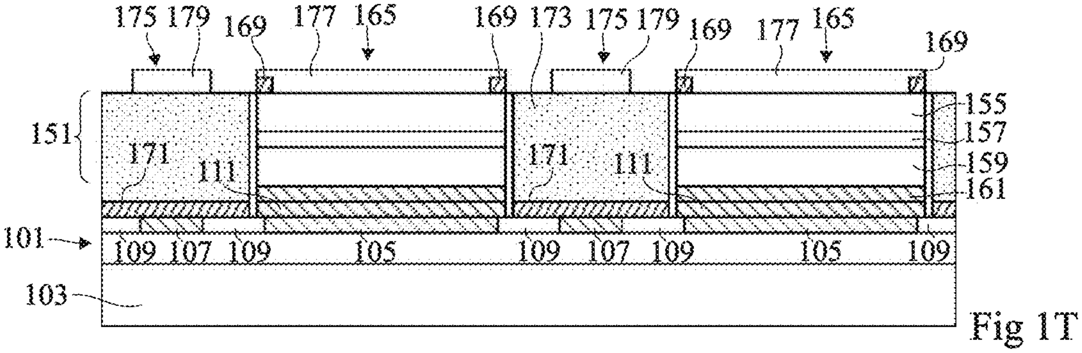

FIGS. 1A to 1T are views illustrating successive steps of a non-limiting example of implementation of such a method. Different variants are within the abilities of those skilled in the art based on the indications of the present disclosure.

There has been shown in FIGS. 1A to 1T the forming of a device comprising pixels, each comprising a single photosensitive diode and three inorganic LEDs. This example is however not limiting, and the described method may of course be adapted to form devices comprising pixels comprising numbers of photosensitive diodes and of inorganic LEDs different from those shown. Further, the described embodiments apply to devices having any emission and reception wavelength ranges, for example each located in infrared or in the visible range.

FIGS. 1A and 1B are respective top and cross-section views along plane AA of FIG. 1A, schematically and partially showing an integrated control circuit 101 previously formed inside and on top of a semiconductor substrate 103. As an example, integrated control circuit 101 is formed inside and on top of a solid silicon substrate. As a variant, semiconductor substrate 103 is of SOI ("Semiconductor On Insulator") type and for example comprises a silicon support coated with an insulating layer, itself coated with a single-crystal silicon layer.

In the shown example, control circuit 101 comprises, on its upper surface side, for each of the LEDs of the device, a metal connection pad 105 intended to be connected to one of the electrodes (anode or cathode) of the LED, to be able to control a current flowing through the LED and/or to apply a voltage across the LED. Control circuit 101 further comprises, for each LED connected to the metal pad 105 dedicated to the LED, an elementary control cell comprising one or a plurality of transistors, enabling to control the current flowing through the LED and/or the voltage applied across the LED.

In this example, control circuit 101 further comprises, on its upper surface side, for each of the photosensitive diodes of the device, a metal pad 107 intended to be connected to one of the electrodes (anode or cathode) of the photosensitive diode, to be able to receive charges photogenerated in the photosensitive diode. Control circuit 101 for example comprises, for each photosensitive diode connected to the metal pad 107 dedicated to the photosensitive diode, an elementary readout cell comprising one or a plurality of transistors, for example enabling to transfer the charges photogenerated in the photosensitive diode to a sense node.

In the considered example where the device comprises a single photosensitive diode and three inorganic LEDs per pixel, control circuit 101 comprises three times more pads 105 than pads 107. As illustrated in FIG. 1A, pads 105 and 107 for example form a pattern regularly repeated along rows and columns at the surface of control circuit 101.

Control circuit 101 is for example formed in CMOS technology ("Complementary Metal Oxide Semiconductor"). Metal pads 105 and 107 may be laterally surrounded with an insulating material 109, for example, silicon oxide, so that control circuit 101 has a substantially planar upper surface comprising an alternation (or checkerboard) of metal regions 105, 107 and of insulating regions 109. The contact on the electrodes of the LEDs and of the photosensitive diodes (cathodes or anodes) which are not connected to pads 105, 107 may be taken collectively, for example, in a peripheral region of control circuit 101, via one or a plurality of connection pads (not shown in the drawings) of control circuit 101.

FIG. 1C is a cross-section view, along plane AA of FIG. 1A, illustrating a subsequent step of deposition, on the upper surface of control circuit 101, of a metal layer 111. In the shown example, metal layer 111 coats substantially the entire upper surface of control circuit 101. In particular, metal layer 111 is in contact with the metal connection pads 105 and 107 of control circuit 101.

FIG. 1D is a cross-section view schematically and partially showing an active inorganic LED stack 151, for example, made of gallium nitride, arranged on the upper surface of a support substrate 153. Support substrate 153 is for example a substrate made of silicon, of sapphire, of corundum, or of any other material onto which an active gallium nitride LED stack can be deposited. In the shown example, active stack 151 comprises, in the order from the upper surface of substrate 153, a layer 155 made of an N-type doped material, for example, an N-type doped gallium nitride layer, an emissive layer 157, and a layer 159 made of a P-type doped semiconductor material, for example, a P-type doped gallium nitride layer. Emissive layer 157 is for example formed of a stack of one or a plurality of emissive layers each forming a quantum well, for example, containing GaN, InN, InGaN, AlGaN, AlN, AlInGaN, GaP, AlGaP, AlInGaP, or a combination of one or a plurality of these materials. In the present example, the lower surface of emissive layer 157 is in contact with the upper surface of layer 155, and the upper surface of emissive layer 157 is in contact with the lower surface of layer 159. In practice, according to the nature of substrate 153, a stack of one or a plurality of buffer layers (not shown) may form an interface between support substrate 153 and gallium nitride layer 155. Active stack 151 is for example formed by epitaxy on support substrate 153.

FIG. 1E is a cross-section view illustrating a subsequent step of deposition, on the upper surface of active LED stack 151, of a metal layer 161. In the shown example, metal layer 161 is arranged on top of and in contact with the upper surface of P-type semiconductor layer 159. Metal layer 161 for example coats substantially the entire upper surface of active stack 151.

FIG. 1F is a cross-section view, along plane AA of FIG. 1A, illustrating a subsequent step during which active LED stack 151 is transferred onto the upper surface of control circuit 101. For this purpose, the assembly comprising support substrate 153, active stack 151, and metal layer 161 may be flipped, and then transferred onto control circuit 101, to place into contact the upper surface (in the orientation of FIG. 1F) of metal layer 161 with the upper surface of metal layer 111. During this step, active stack 151 is bonded to control circuit 101. As an example, the bonding of active stack 151 to control circuit 101 may be obtained by molecular bonding between the two surfaces placed into contact. As a variation, the bonding of the two surfaces may be performed by thermocompression, eutectic bonding, or by any other adapted bonding method.

Further, during this step, the support substrate 153 of active LED stack 151 is removed to expose the upper surface of (in the orientation of FIG. 1F) of N-type semiconductor layer 155. Substrate 153 is for example removed by grinding and/or etching from its surface opposite to active stack 151. As a variant, in the case of a transparent substrate 153, for example, a sapphire or corundum substrate, substrate 151 may be separated from active stack 153 by means of a laser beam projected through substrate 151 from its surface opposite to active stack 150 (method of lift-off laser type). More generally, any other method enabling to remove substrate 153 may be used. After the removal of substrate 153, an additional etch step may be provided to remove possible buffer layers remaining on the upper surface side of semiconductor layer 155. Further, a portion of the thickness of semiconductor layer 155 may be removed, for example, by etching. At the end of this step, active stack 151 coats substantially the entire surface of control circuit 101, with no discontinuity. As an example, the thickness of active stack 151 after the removal of support substrate 153 is in the range from 0.5 to 2 μm.

FIGS. 1G and 1H are views, respectively a top view and a cross-section view along plane AA of FIG. 1G, showing a subsequent step of forming of through openings or trenches 163 in active stack 151, for example, by plasma etching through a mask (not shown) previously deposited on the upper surface side of active stack 151. Trenches 163 extend from the upper surface of N-type semiconductor layer 155 through layers 155, 157, and 159 of active stack 151, the etching being interrupted on the upper surface of metal layer 161. The forming of trenches 163 through active stack 151 results in delimiting, in active stack 151, a plurality of LEDs 165. Each LED 165 corresponds to an island or mesa formed in stack 151 and laterally surrounded with a trench 163. Each LED 165 thus comprises a vertical stack comprising, in the order from the upper surface of metal layer 161, a portion of P-type semiconductor layer 159, corresponding to the anode of the LED, a portion of emissive layer 157, and a portion of N-type semiconductor layer 155, corresponding to the cathode of the LED. Trenches 163 may be aligned with respect to marks previously formed on control circuit 101. More particularly, after the deposition of the etch mask but before the forming of trenches 163, marks previously formed on substrate 103 may be exposed by etching of the mask and of active stack 151 in peripheral areas of the assembly, theses marks then being used as alignment marks for the positioning of the mask used to form trenches 163. In the shown example, each LED 165 is located, in vertical projection, in front of a single metal pad 105 of control circuit 101. In this example, trenches 163 are located, in vertical projection, in front of the metal pads 107 of the future photosensitive diodes and of the insulating regions 109 of the upper surface of control circuit 101.

FIG. 1I is a cross-section view, along plane AA of Figure G, illustrating a subsequent step of removal, for example, by plasma etching, of portions of metal layers 161 and 111 located at the bottom of trenches 163, to continue trenches 163 all the way to the metal and insulating regions 107 and 109 of the upper surface of control circuit 101. At the end of this step, the anodes (regions 159) of the different LEDs 165 are electrically insulated from one another by trenches 163, and each LED 165 has its anode connected to underlying metal pad 105 via portions of metal layers 161 and 111 remaining between the LED and pad 105. This enables to individually control the LEDs with control circuit 101. Further, at the end of this step, the upper surface of metal regions 107 is exposed.

FIG. 1J is a cross-section view, along plane AA of FIG. 1G, illustrating a subsequent step of deposition of an insulating layer 167, for example, a passivation layer made of oxide or of silicon nitride or of aluminum oxide, on the lateral walls and on the bottom of trenches 163. In the shown example, layer 167 is further deposited on the upper surface of the portions of the active stack 151 of LEDs 165. Layer 167 is for example deposited over the entire upper surface of the device by a conformal deposition method, for example, by atomic layer deposition (ALD). As an example, the thickness of layer 167 is in the range from 10 nm to 1 μm.

FIG. 1K is a cross-section view, along plane AA of FIG. 1G, illustrating a subsequent step of removal of insulating layer 167 from the bottom of trenches 163. During this step, layer 167 is kept on the lateral walls of trenches 163. To achieve this, layer 167 is for example etched by vertical anisotropic etching, which further leads to removing layer 167 from the upper surface of the portions of hard mask 151 topping LEDs 165.

In a case where the LEDs and the photosensitive diodes of the device have close operating wavelengths (that is, emission and detection wavelengths, respectively), a stack of one or a plurality of opaque lateral optical insulation layers (not shown), adapted to blocking the emission of light from the LEDs towards the photosensitive diodes, may coat the portions of layer 167 which remain on the sides of LEDs 165 to particularly avoid optical crosstalk phenomena. The stack is for example formed of one or a plurality of thin metal layers, of one or a plurality of black organic resin layers, or of a combination of one or a plurality of these layers.

FIGS. 1L and 1M are respective top and cross-section views along plane AA of FIG. 1L, illustrating a subsequent step of anisotropic deposition, on the upper surface side of control circuit 101, of an electrically-conductive layer 169. In the shown example, conductive layer 169 coats the upper surface of LEDs 165 as well as the bottom of trenches 163, but does not coat the sides of LEDs 165. More precisely, in this example, conductive layer 169 coats the upper surface of the portions of the N-type semiconductor layer 155 of LEDs 165 as well as the metal and insulating regions 107 and 109 of the control circuit 101 previously exposed at the bottom of trenches 163, but does not coat the portions of insulating layer 167. As an example, electrically-conductive layer 169 is made of a metal, a metal alloy, or a transparent conductive oxide (TCO), for example indium tin oxide (ITO).

FIGS. 1N and 1O are respective top and cross-section views along plane AA of FIG. 1N, illustrating a subsequent step of local removal of conductive layer 169, for example, by photolithography and then etching. As an example, during this step, an etch mask (not shown), for example formed by photolithography, may be arranged on the upper surface of the structure, this mask being open in front of portions of the conductive layer 169 to be removed. The mask can then be removed after the etching.

During this step, portions of layer 169 coating the upper surface of the layer 155 of the LEDs 165 of the device are more precisely removed. In the case where conductive layer 169 is made of a material opaque to the emission wavelengths of LEDs 165, for example, an opaque metal, the emission surface of LED 165 is defined by an area of layer 155 above which conductive layer 169 has been removed. It is thus for example advantageous, in this case, to remove the most part of layer 169 at the surface of the portions of layer 155 to be able to benefit from a maximum emission surface area. As a variant, in the case where conductive layer 169 is made of a material transparent to the emission wavelengths of LEDs 165, for example, a transparent conductive oxide, the portions of layer 169 coating the upper surface of LEDs 165 may be kept.

Further, during this step, portions of conductive layer 169 coating the insulating regions 109 of control circuit 101 are removed, to define, in conductive layer 169, a plurality of anode electrodes 171 of the future photosensitive diodes of the device. In the shown example, each anode electrode 171 is located, in vertical projection, in front of a single metal pad 107 of control circuit 101. At the end of this step, the anode electrodes 171 of the future photosensitive diodes are electrically insulated from one another, each anode electrode 171 being further connected to the underlying metal pad 107. This allows an individual control of the photosensitive diodes by control circuit 101.

FIGS. 1P and 1Q are respective top and cross-section views along plane AA of FIG. 1P, illustrating a subsequent step of deposition of an active photosensitive semiconductor layer 173, or photodetection layer, on the lateral walls and on the bottom of trenches 163. In the shown example, layer 173 entirely fills trenches 163, so that layer 173 is flush with the upper portion active LED stack 151. In other words, layer 173 totally fills all the spaces left free between LEDs 165. In other words, there remains no free space between LEDs 165 after the deposition of active semiconductor layer 173. As a variant, layer 173 may have a height smaller than that of stack 151, for example, in the range from 0.5 to 1 μm.

Active layer 173 is for example an organic layer comprising one or a plurality of semiconductor polymer materials, a layer comprising quantum dots (QDs), or a layer comprising quantum dots in a polymer matrix, or also any type of organic layer performing a photon capture function. In the present disclosure, the term "organic layer" includes an organic layer integrating inorganic quantum dots. As an example, the organic layer comprises inorganic nanocrystals surrounded with organic ligands. According to the considered material, the deposition of active layer 173 may be performed, for example, by liquid deposition. More precisely, active layer 173 may for example be obtained by a technique of spin coating or blade coating of a solution of polymer and/or quantum dots, for example, a colloidal solution of semiconductor nanocrystals. In practice, a stack of one or a plurality of hole injection and/or transport layers (not shown) may be deposited on the bottom of trenches 163 prior to the deposition of active layer 173.

The filling of trenches 163 with active layer 173 results in forming a plurality of photosensitive diodes 175, or photodetectors. Each photosensitive diode 175 comprises a vertical stack comprising, in the order from the upper surface of control circuit 101, a portion of conductive layer 169, corresponding to the anode electrode 171 of the photosensitive diode, and a portion of active layer 173 located substantially vertically in line with anode 171. Advantageously, active layer 173 for example has anisotropic electric conduction properties. More precisely, active layer 173 for example has a low lateral electric conduction, enabling to electrically insulate each photosensitive diode 175 with respect to the neighboring photosensitive diodes, and a strong vertical electric conduction, for example, greater than the lateral electric conduction, to ease the vertical transport of the carriers photogenerated in active layer 173 to the electrodes of photosensitive diode 175. In practice, a stack of one or a plurality of electron injection and/or transport layers (not shown) may be subsequently deposited on active layer 173.

FIG. 1R is a top view illustrating a subsequent step of forming of the common cathode electrode on the stacks of LEDs 165 and of photosensitive diodes 175 of the device. FIGS. 1S and 1T are cross-section views along planes, respectively AA and BB, of FIG. 1R, of this same step. In the shown example, cathode electrodes 177 common to all the LEDs 165 of a same row of LEDs of the device and cathode electrodes 179 common to all the photosensitive diodes 175 of a same row of photosensitive diodes of the device are more precisely formed. Cathode electrodes 177 and 179 are for example made of a transparent conductive oxide, for example, ITO. The material of cathode electrodes 177 and 179 is for example deposited over the entire surface of the stack, for example, by physical vapor deposition (PVD) and then anneal at a temperature of approximately 100° C. The material is then etched, for example by low-energy plasma etching or by wet etching, for example, based on hydrochloric acid, to form common cathode electrodes 177 and 179. As a variant, in a case where the LEDs 165 and the photosensitive diodes 175 of the device have similar bias voltages, a single cathode electrode common to all the LEDs 165 and to all the photosensitive diodes 175 of the device may be provided, the individual control of LEDs 165 and of photosensitive diodes 175 being performed through conductive pads 105 and 107, respectively.

In the shown example, there is obtained, at the end of the steps described in relation with FIGS. 1A to 1T, a device combining light emission and photodetection functions.

Figure 2A:
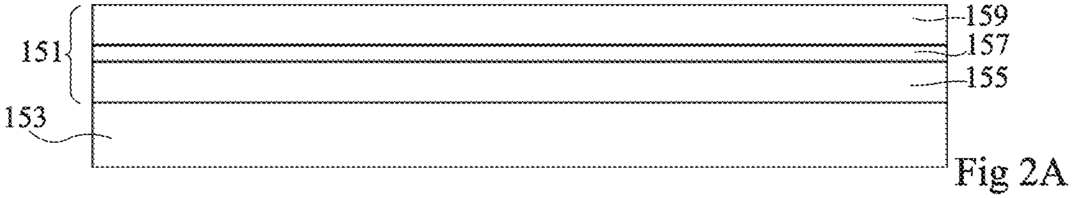
FIGS. 2A, 2B, 2C, 2D, 2E, 2F, 2G, 2H, 2I, 2J, 2K, 2L, 2M, 2N, 2O, 2P, 2Q, 2R, 2S, 2T, 2U, and 2V are partial simplified views illustrating other successive steps of an example of an optoelectronic device manufacturing method according to an embodiment.
Figure 2B:
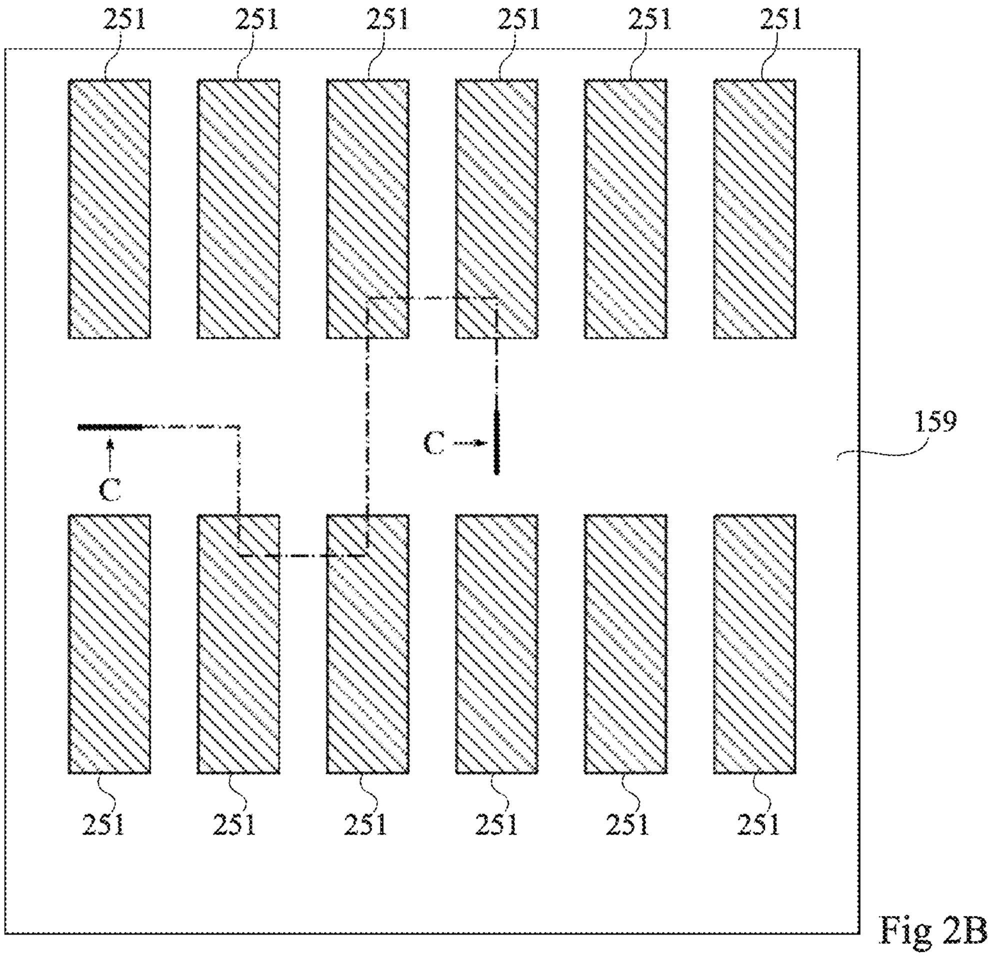
Figure 2C:
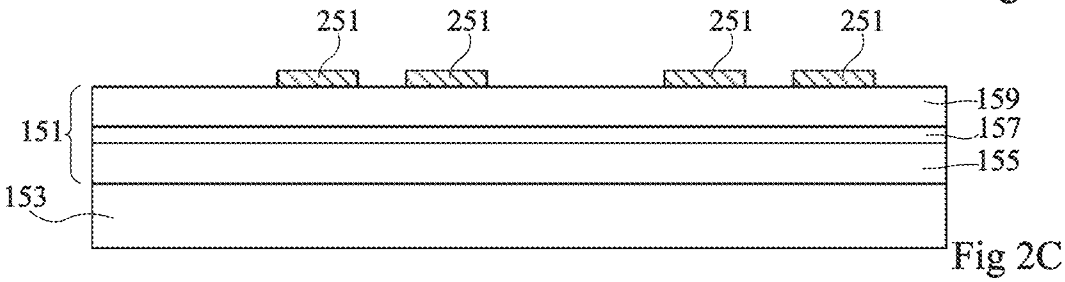
Figure 2D:
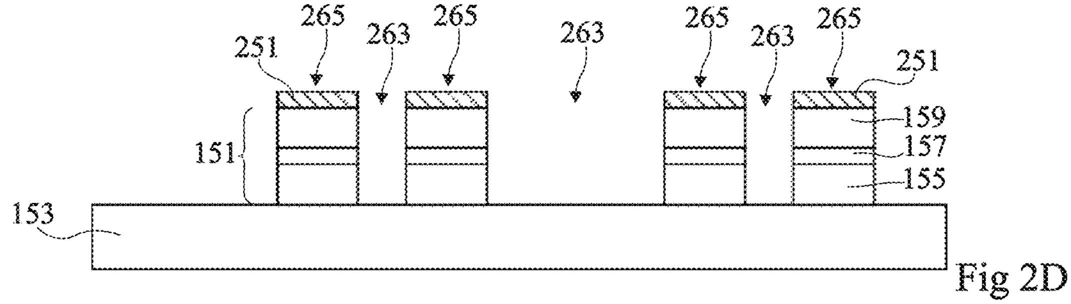
Figure 2E:
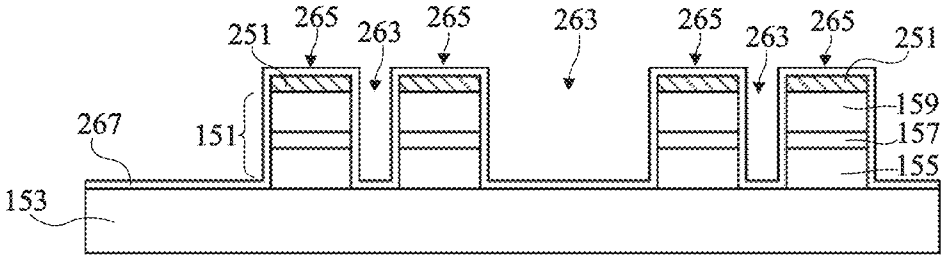
Figure 2F:
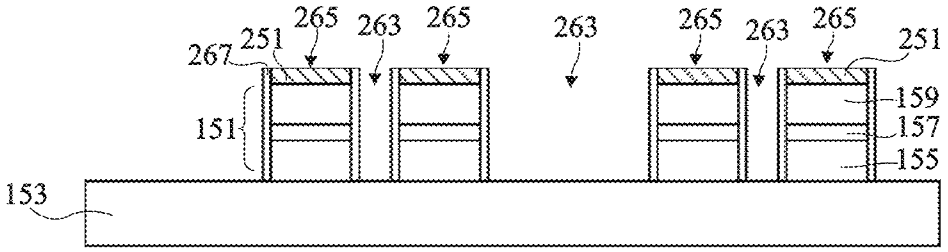
Figure 2G:
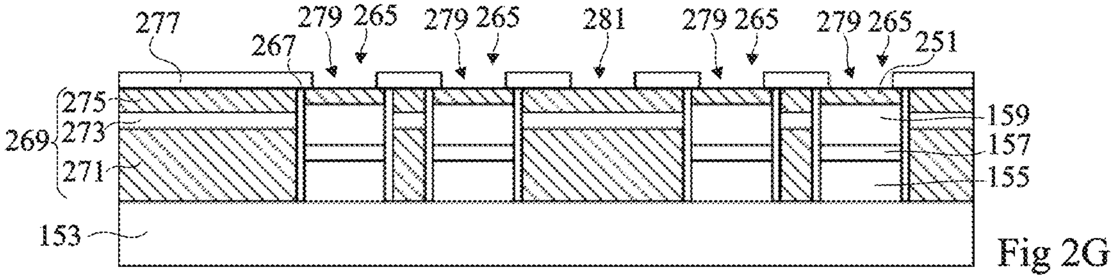
Figure 2H:
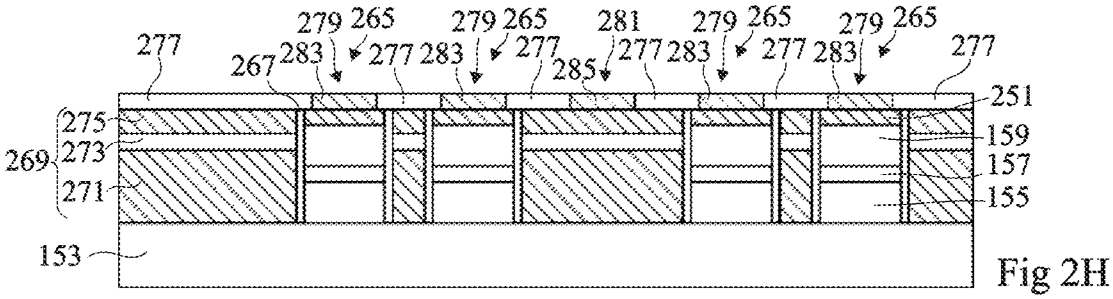
Figure 2I:
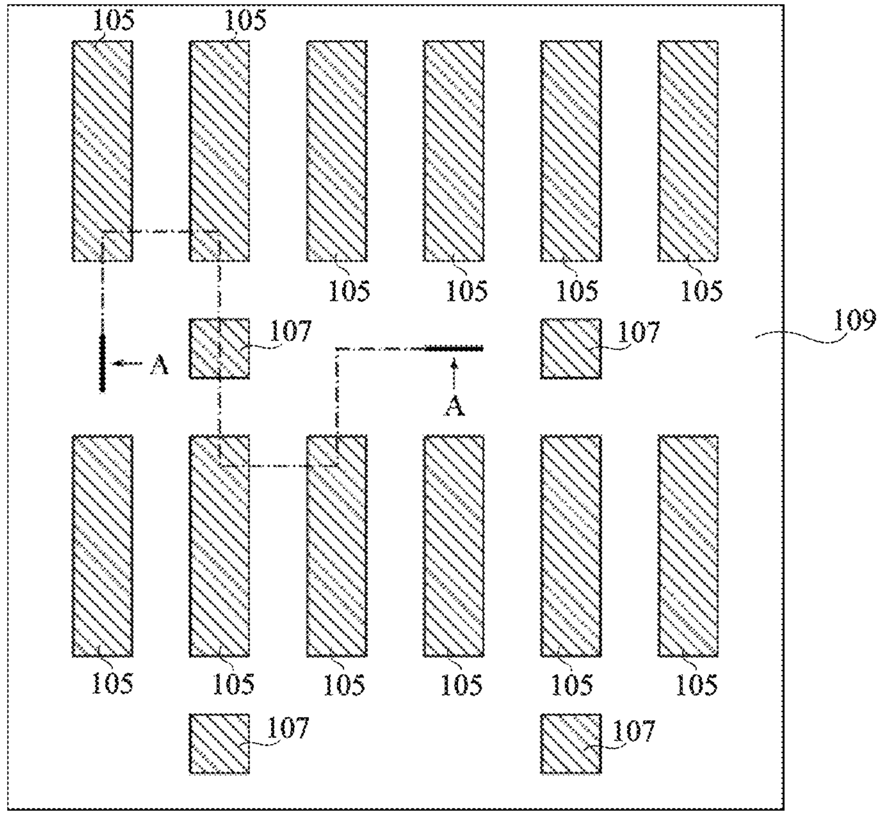
Figure 2J:
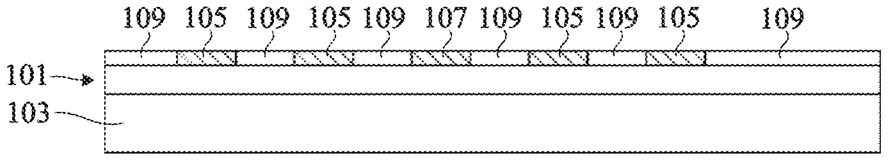
Figure 2K:
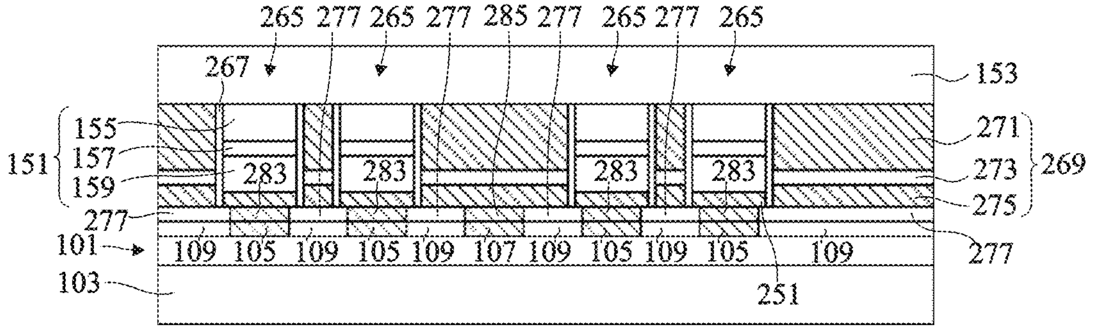
Figure 2L:
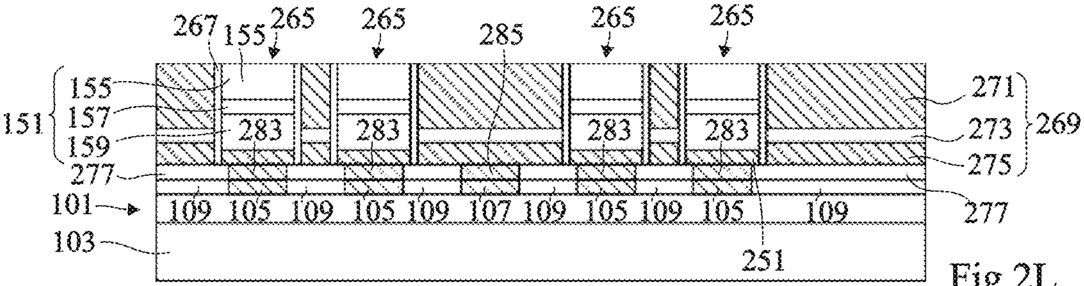
Figure 2M:
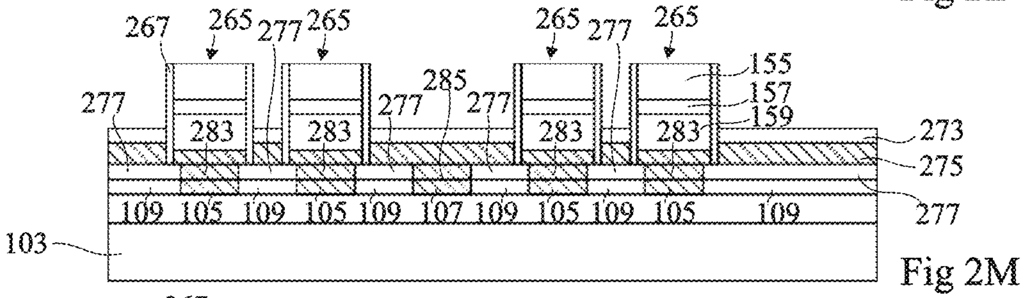
Figure 2N:
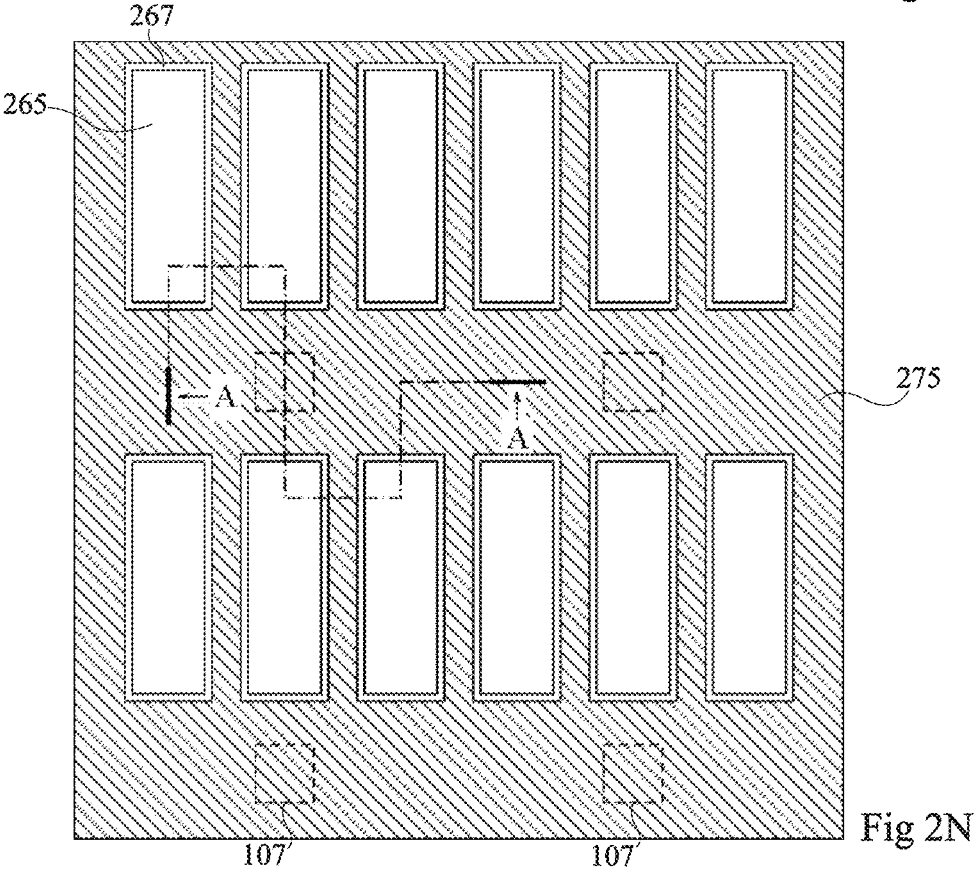
Figure 2O:
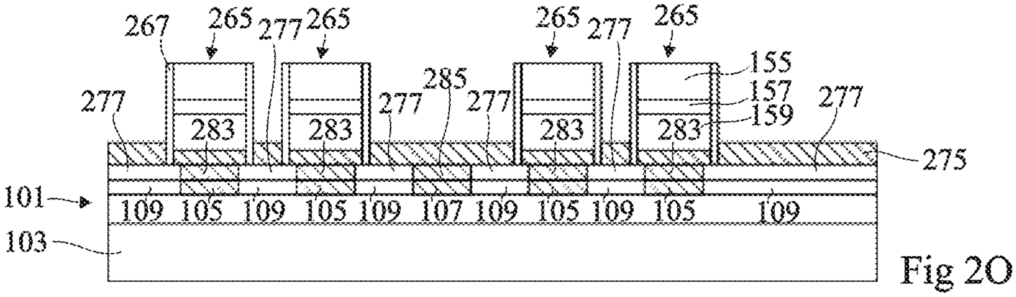
Figure 2P:
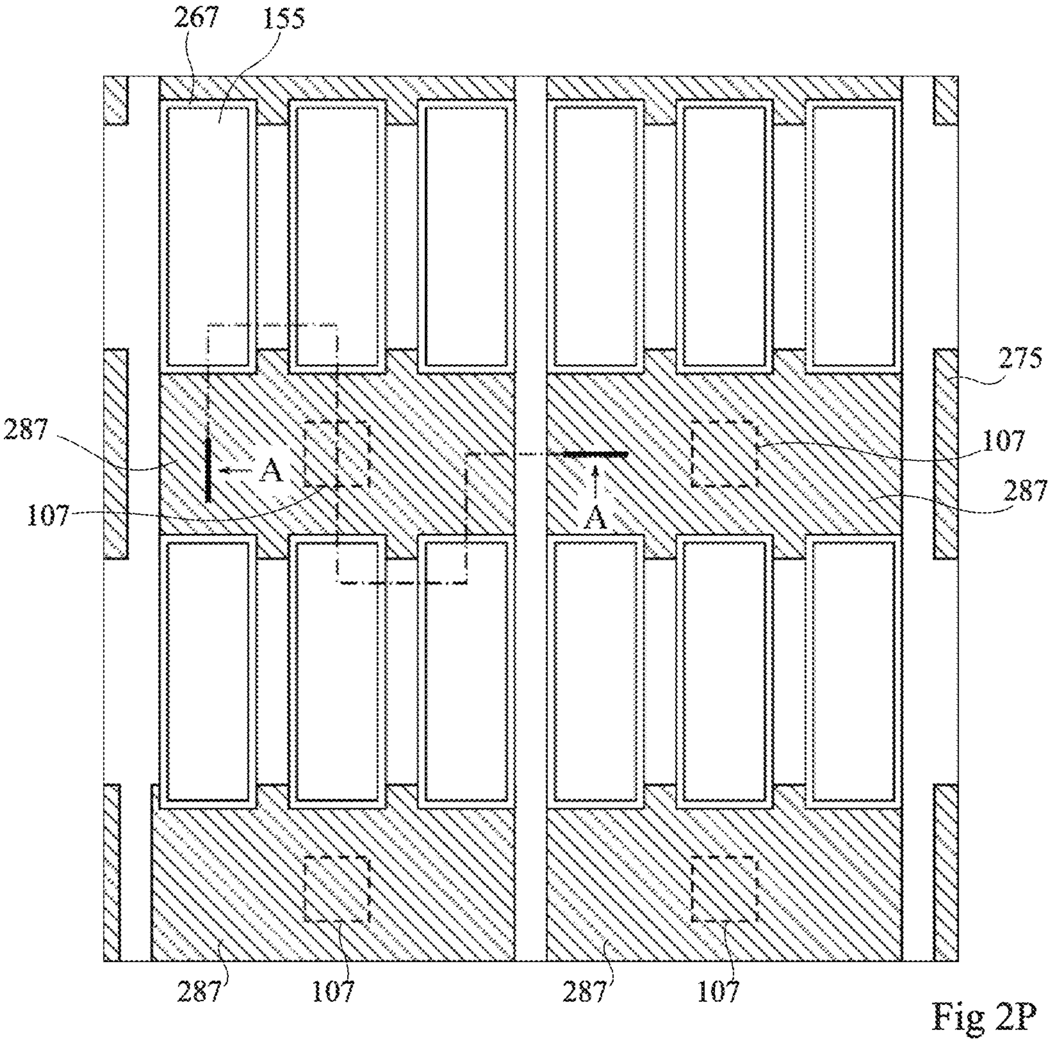
Figure 2Q:
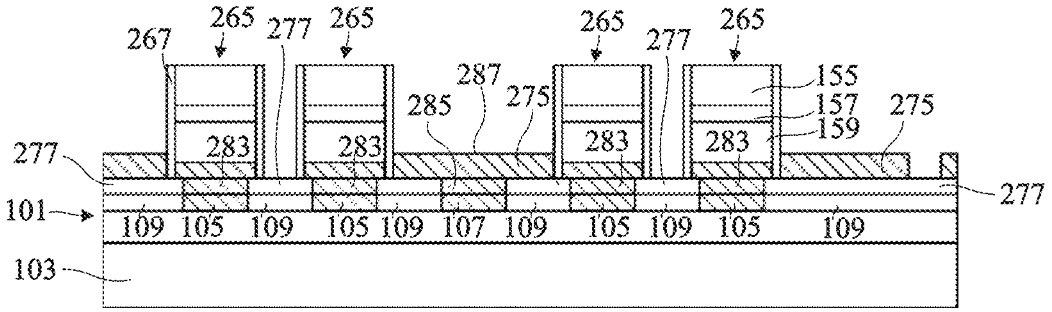
Figure 2R:
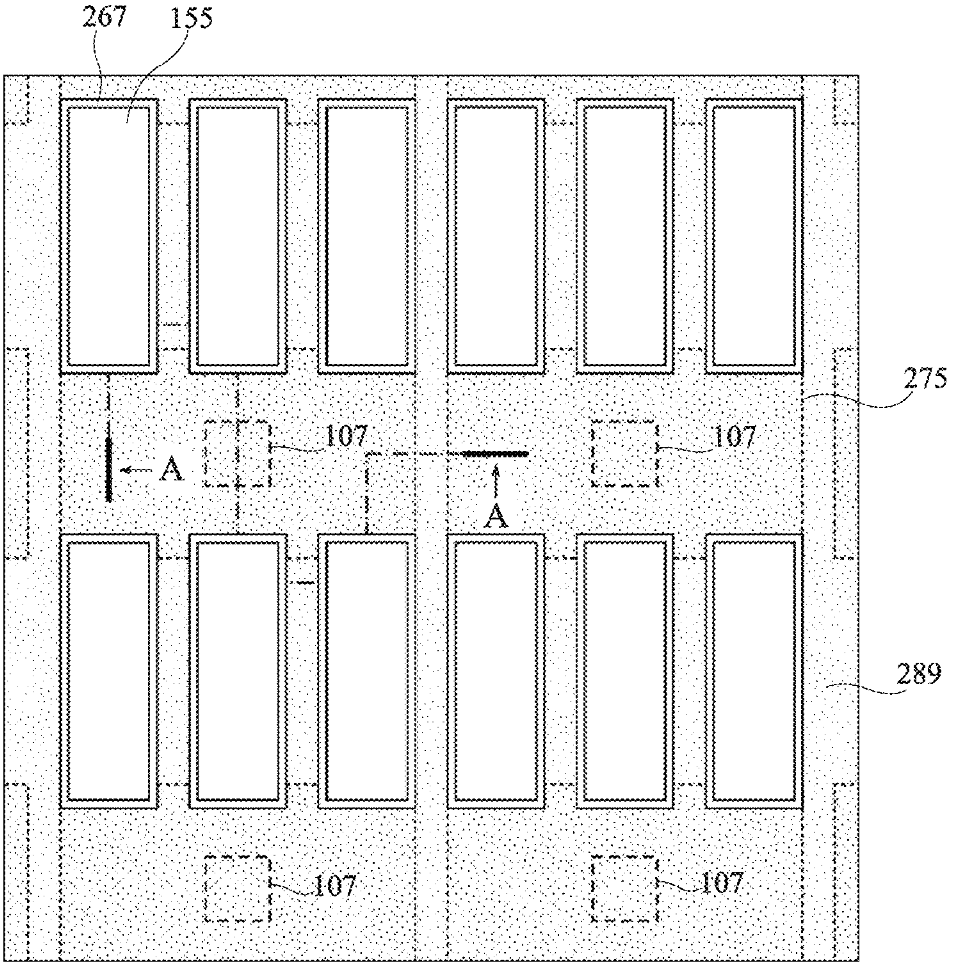
Figure 2S:
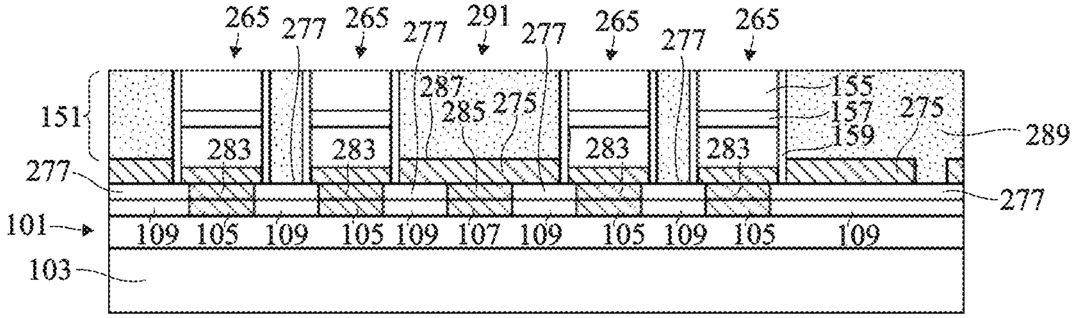
Figure 2T:
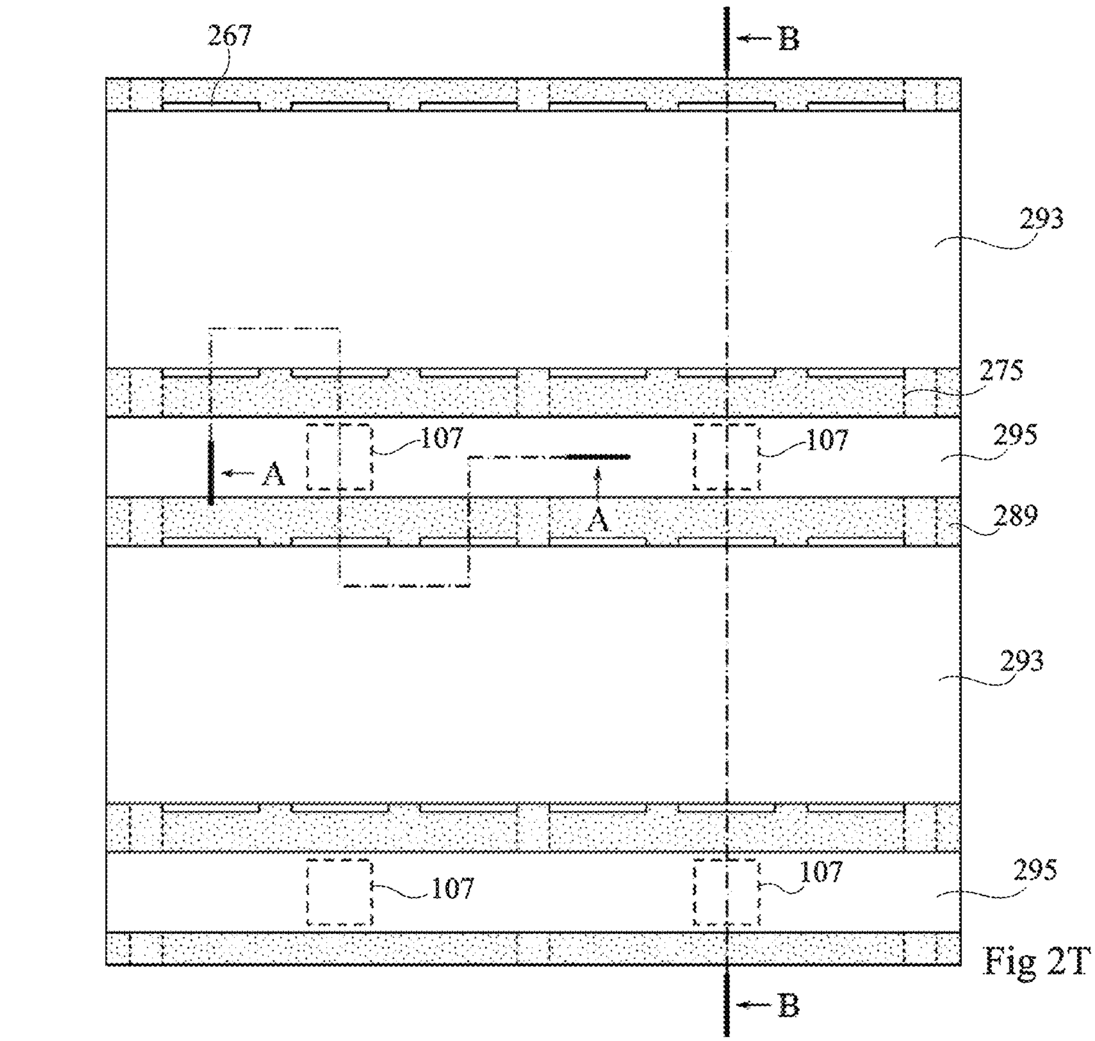
Figure 2U:
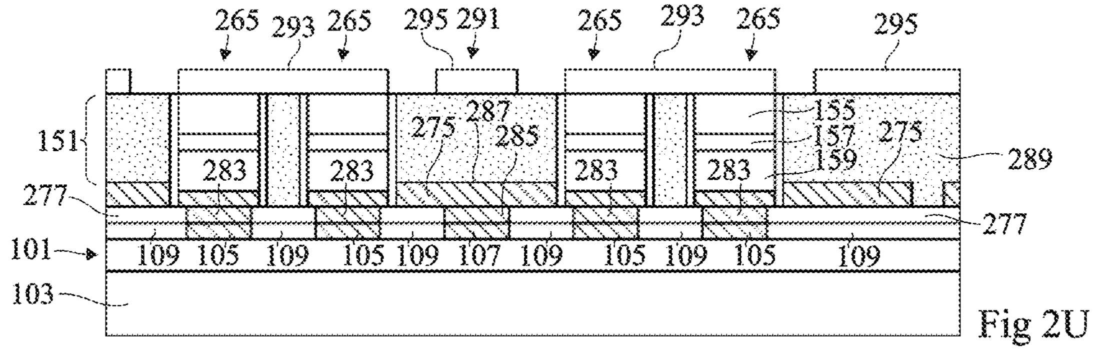
Figure 2V:
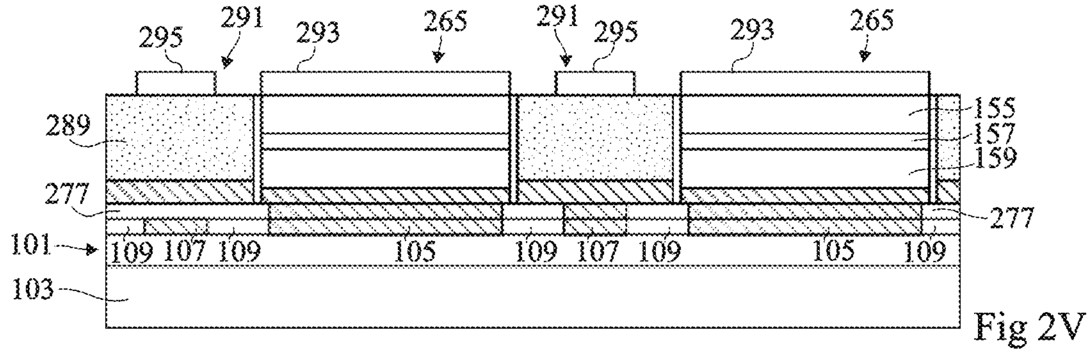

FIGS. 2A to 2V are partial simplified views illustrating other successive steps of an example of a method of manufacturing an optoelectronic device according to an embodiment.

FIG. 2A is a cross-section view schematically and partially showing an active LED stack arranged on the upper surface of a support substrate. The active LED stack and the support substrate illustrated in FIG. 2A are for example similar to the active LED stack 151 and to the support substrate 153 previously described in relation with FIG. 1D, and will not be detailed again hereafter.

FIGS. 2B and 2C are views, respectively a top view and a cross-section view along plane CC of FIG. 2B, illustrating a subsequent step of forming, on the upper surface side of active LED stack 151, for each of the LEDs of the device, of a metal connection pad 251 intended to be connected to one of the electrodes (anode or cathode) of the LED, to be able to control a current flowing through the LED and/or to apply a voltage across the LED. As an example, metal connection pads 251 are formed by photolithography and etching from a metal layer deposited over the entire upper surface of the P-type semiconductor layer 159 of active LED stack 151.

FIG. 2D is a cross-section view, along plane CC of FIG. 2B, showing a subsequent step of forming of through openings or trenches 263 in active stack 151, for example, by plasma etching. During the etching, metal connection pads 251 for example play the role of a mask. Trenches 263 extend from the upper surface of the P-type semiconductor layer 159 through layers 159, 157, and 155 of LED stack 151, the etching being interrupted on the upper surface of support substrate 153. The forming of trenches 263 through active stack 151 results in delimiting, in active stack 151, a plurality of LEDs 265. Each LED 265 corresponds to an island or mesa formed in stack 151 and laterally surrounded with a trench 263. Thus, each LED 265 comprises a vertical stack comprising, in the order from the upper surface of support substrate 153, a portion of N-type semiconductor layer 155, corresponding to the cathode of the LED, a portion of emissive layer 157, a portion of P-type semiconductor layer 159, corresponding to the anode of the LED, and a metal connection pad 251.

FIG. 2E is a cross-section view along plane CC of FIG. 2B, illustrating a subsequent step of deposition of an insulating layer 267, for example, a silicon oxide or nitride passivation layer, on the lateral walls and on the bottom of trenches 263. In the shown example, layer 267 further coats the lateral walls and the upper surface of metal connection pads 251. Layer 267 is for example deposited over the entire upper surface of the device by a conformal deposition method, for example, by atomic layer deposition (ALD). As an example, the thickness of layer 267 is in the range from 10 nm to 1 μm.

FIG. 2F is a cross-section view, along plane CC of FIG. 2B, illustrating a subsequent step of removal of insulating layer 267 from the bottom of trenches 263. During this step, layer 267 is kept on the lateral walls or sides of trenches 263 and of metal connection pads 251. To achieve this, layer 267 is for example etched by vertical anisotropic etching, which further leads to removing layer 267 from the upper surface of the portions of hard mask 251 topping LEDs 265.

In a case similar to what has been previously described in relation with FIG. 1K, when the LEDs and the photosensitive diodes of the device have close operating wavelengths (that is, emission and detection wavelengths, respectively), a stack of one or a plurality of opaque lateral optical insulation layers (not shown), adapted to blocking the emission of light from the LEDs towards the photosensitive diodes, may coat the portions of layer 267 which remain on the sides of LEDs 265. The stack is for example formed of one or a plurality of thin metal layers, of one or a plurality of black organic resin layers, or of a combination of one or a plurality of these layers.

FIG. 2G is a cross-section view along plane CC of FIG. 2B, illustrating a subsequent step of deposition of a stack 269 of electrically-conductive and electrically-insulating layers on the bottom of trenches 263. In the shown example, stack 269 comprises, in the order from the upper surface of substrate 153, a conductive layer 271, for example, a metal layer, an insulating layer 273, for example, made of silicon oxide, and another conductive layer 275, for example, a metal layer. In this example, the lower surface of insulating layer 273 is in contact with the upper surface of conductive layer 271, and the upper surface of insulating layer 273 is in contact with the lower surface of conductive layer 275. In the shown example, stack 269 entirely fills trenches 263, so that conductive layer 275 is flush with the upper surface of metal connection pads 251.

Further, during this step, an electrically-insulating layer 277 is deposited on the upper surface of the structure. Insulating layer 277 for example coats substantially the entire upper surface of conductive layer 275 and the entire upper surface of metal connection pads 251.

Through openings or trenches 279 are then formed in insulating layer 277, in front of metal connection pads 251, to at least partially expose the upper surface of metal connection pads 251. Further, during this step, other through openings or trenches 281 are formed in insulating layer 277. Trenches 281 are for example vertically in line with areas located between LEDs 265 where the photosensitive diodes of the device are desired to be subsequently formed. As an example, trenches 279 and 281 are formed by photolithography and etching of insulating layer 277.

FIG. 2H is a cross-section view along plane CC of FIG. 2B illustrating a subsequent step of forming, inside of trenches 279, of metal connection pads 283. In the shown example, pads 283 are located on top of and in contact with the upper surface of metal connection pads 251 and entirely fill trenches 279, that is, pads 283 are flush with the upper surface of insulating layer 277. Further, during this step, metal connection pads 285 are formed inside of trenches 281. In the shown example, pads 285 are located on top of and in contact with the upper surface of conductive layer 275 and entirely fill trenches 281, that is, pads 285 are flush with the upper surface of insulating layer 277. As an example, metal connection pads 283 and 285 as well as the portions of insulating layer 277 remaining between these pads are obtained by a "damascene"-type method.

FIGS. 2I and 2J are views, respectively a top view and a cross-section view along plane AA of FIG. 2I, schematically and partially showing an integrated control circuit previously formed inside and on top of a semiconductor substrate. The integrated control circuit and the semiconductor substrate illustrated in FIGS. 2I and 2J are for example similar to the integrated control circuit 101 and to the semiconductor substrate 103 previously described in relation with FIGS. 1A and 1B and will not be detailed again hereafter.

FIG. 2K is a cross-section view, along plane AA of FIG. 2I, illustrating a subsequent step during which LEDs 265 are transferred onto the upper surface of control circuit 101. For this purpose, the assembly obtained at the end of the step previously described in relation with FIG. 2H may be flipped, and then placed onto control circuit 101, to place into contact the lower surface (in the orientation of FIG. 2K) of insulating layer 277 with the upper surface of insulating layer 109, the lower surface of pads 283 with the upper surface of pads 105, and the lower surface of pads 285 with the upper surface of pads 107. During this step, LEDs 265 are bonded to control circuit 101. As an example, the bonding of LEDs 265 to control circuit 101 may be obtained by hybrid molecular bonding between the two surfaces placed into contact. As a variation, the bonding of the two surfaces may be performed by thermocompression, eutectic bonding, or by any other adapted bonding method. At the end of this step, each LED 265 has its anode (region 159) connected to the underlying metal pad 105 via pads 283 and 251 between the LED and pad 105. This allows an individual control of the LEDs by control circuit 101.

FIG. 2L is a cross-section view, along plane AA of FIG. 2I, illustrating a subsequent step during which support substrate 153 is removed to expose the upper surface (in the orientation of FIG. 2L) of N-type semiconductor layer 155. Substrate 153 is for example removed by grinding and/or etching from its surface opposite to active stack 151. As a variant, in the case of a transparent substrate 153, for example, a sapphire or corundum substrate, substrate 153 may be separated from active stack 151 by means of a laser beam projected through substrate 153 from its surface opposite to active stack 151 (method of laser lift-off type). More generally, any other method enabling to remove substrate 153 may be used. After the removal of substrate 153, an additional etch step may be provided to remove possible buffer layers remaining on the upper surface side of semiconductor layer 155. Further, a portion of the thickness of semiconductor layer 155 may be removed, for example, by etching.

FIG. 2M is a cross-section view, along plane AA of FIG. 2I, illustrating a subsequent step of removal of the entire conductive layer 271. According to an embodiment, conductive layer 271 is removed by etching, insulating layer 273 for example being used as a stop layer.

FIGS. 2N and 2O are respective top and cross-section views along plane AA of FIG. 2N, illustrating a subsequent step of removal of the entire insulating layer 273.

FIGS. 2P and 2Q are respective top and cross-section views along plane AA of FIG. 2P, illustrating a subsequent step of local removal of conductive layer 275, for example, by photolithography and etching. As an example, during this step, an etch mask (not shown), for example formed by photolithography, may be arranged on the upper surface of the structure, this mask being open in front of portions of the conductive layer 275 to be removed. The mask can then be removed after the etching.

During this step, portions of conductive layer 275 are for example more precisely removed to define, in conductive layer 275, a plurality of anode electrodes 287 of the future photosensitive diodes of the device. In the shown example, each anode electrode 287 is located, in vertical projection, in front of a single metal pad 107 of control circuit 101. At the end of this step, the anode electrodes 287 of the future photosensitive diodes are electrically insulated from one another, each anode electrode 287 being further connected to the underlying metal pad 107. This allows an individual control of the photosensitive diodes by control circuit 101.

FIGS. 2R and 2S are respective top and cross-section views along plane AA of FIG. 2R, illustrating a subsequent step of deposition of a photosensitive active semiconductor layer 289, or photodetection layer, on the upper surface side of the structure obtained at the end of the previous step. In the shown example, layer 289 entirely fills spaces laterally extending between LEDs 265, so that layer 289 is flush with the upper surface of layer 155 of LEDs 265. As a variant, layer 289 may have a height smaller than that of stack 151, for example, in the range from 0.5 to 1 μm. Active layer 289 is for example made of the same material as the layer 173 previously described in relation with FIGS. 1P and 1Q.

The filling of the free spaces between LEDs 265 with active layer 289 results in forming a plurality of photosensitive diodes 291, or photodetectors. Each photosensitive diode 291 comprises a vertical stack comprising, in the order from the upper surface of control circuit 101, pad 285, a portion of conductive layer 275, corresponding to the anode electrode 287 of the photosensitive diode, and a portion of active layer 289 located substantially vertically in line with anode electrode 287. In practice, a stack of one or a plurality of electron injection and/or transport layers (not shown) may subsequently be deposited on active layer 289.

FIG. 2T is a top view illustrating a subsequent step of forming of common cathode electrodes on the stacks of LEDs 265 and of photosensitive diodes 291 of the device. FIGS. 2U and 2V are cross-section views, along planes, respectively AA and BB, of FIG. 2T, of this same step. In the shown example, cathode electrodes 293 common to all the LEDs 265 of a same row of LEDs of the device and cathode electrodes 295 common to all the photosensitive diodes 291 of a same row of photosensitive diodes of the device are more precisely formed. Cathode electrodes 293 and 295 are for example made of a transparent conductive oxide, for example, ITO. Common cathode electrodes 293 and 295 are for example formed in the same way as common cathodes 177 and 179. As a variant, for example in a case where LEDs 265 and the photosensitive diodes 291 of the device have similar operating voltages, a single cathode electrode common to all LEDs 265 and to all the photosensitive diodes 291 of the device may be provided, the individual control of LEDs 265 and of photosensitive diodes 291 being performed by conductive pads 105 and 107, respectively.

In the shown example, there is obtained, at the end of the steps described in relation with FIGS. 2A to 2V, a device combining light emission and photodetection functions.

The methods respectively described in relation with FIGS. 1A to 1T and with FIGS. 2A to 2V may be used to form monolithic microdisplays, combining an image display function and an optical capture function, for example, to form an interactive display screen adapted to implementing functions of face recognition or eye tracking, of shape recognition, of motion detection, of identification, etc. An advantage of the described methods is that they enable to form display pixels and capture pixels of small lateral dimensions, and thus obtain high display resolutions and capture resolutions. It should be noted that in the above-described example, the device comprises macropixels, each comprising a detection pixel and three emission pixels adapted to respectively emitting in three distinct wavelength ranges. In other words, the resolution of the device in emit mode and the resolution of the device in receive mode are identical. As a variant, the resolution of the display device and the resolution of the optical sensor may be different. In particular, the number of detection pixels may be smaller than the number of emission pixels of a same wavelength range. A device comprising three emission pixels adapted to emitting in the visible range and at least another emission pixel adapted to emitting in infrared may further be provided.

As a variant, the methods respectively described in relation with FIGS. 1A to 1T and with FIGS. 2A to 2V may be used to form interactive display devices of larger dimensions, for example, a screen for a television, computer, smartphone, digital tablet, etc. Such a device may comprise a plurality of elementary electronic chips arranged, for example, according to an array layout, on a same transfer substrate. The elementary chips are rigidly mounted on the transfer substrate and connected to electric connection elements of the transfer substrate for their control. Each chip comprises one or a plurality of LEDs 165, 265, one or a plurality of photosensitive diodes 175, 291, and a circuit 101 for controlling said one or a plurality of LEDs and said one of a plurality of photosensitive diodes. Each chip for example corresponds to a macropixel of the device. As an example, each chip comprises three individually-controllable LEDs respectively defining three emission pixels adapted to respectively emitting red light, green light, and blue light, and a photosensitive diode adapted to detecting an infrared or near-infrared radiation, defining a detection pixel.

FIGS. 3A to 3G are cross-section views illustrating successive steps of an example of a method of manufacturing such a device.

Figure 3A:
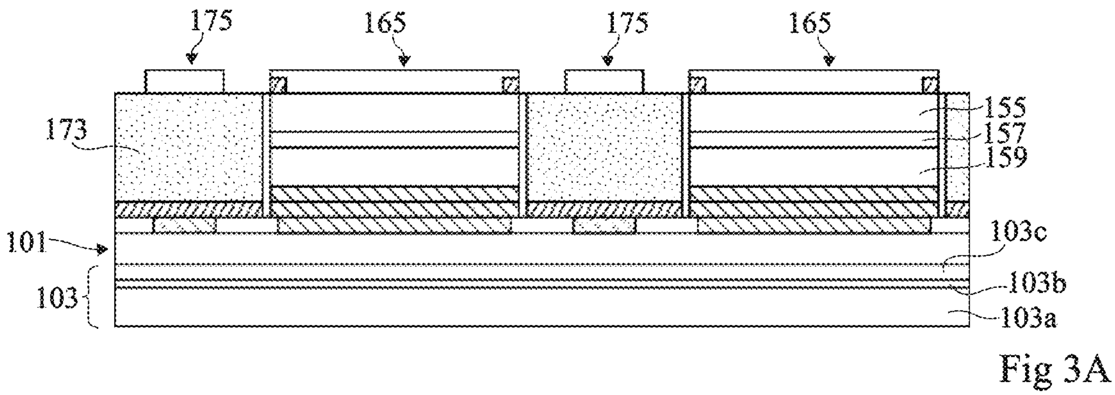
FIGS. 3A, 3B, 3C, 3D, 3E, 3F, and 3G are partial simplified cross-section views illustrating still other successive steps of an example of a method of manufacturing an optoelectronic device according to an embodiment.

FIG. 3A is a cross-section view schematically and partially showing a device similar to the device previously described in relation with FIG. 1T. The device of FIG. 3A differs from the device of FIG. 1T mainly in that the semiconductor substrate 103 of the device of FIG. 3A is of SOI type. In the shown example, the substrate 103 of the device of FIG. 3A comprises a silicon support 103*a* coated with an insulating layer 103*b*, itself coated with a single-crystal silicon layer 103*c*. For clarity, layers 103*a*, 103*b*, and 103*c* are not shown to scale.

Figure 3B:
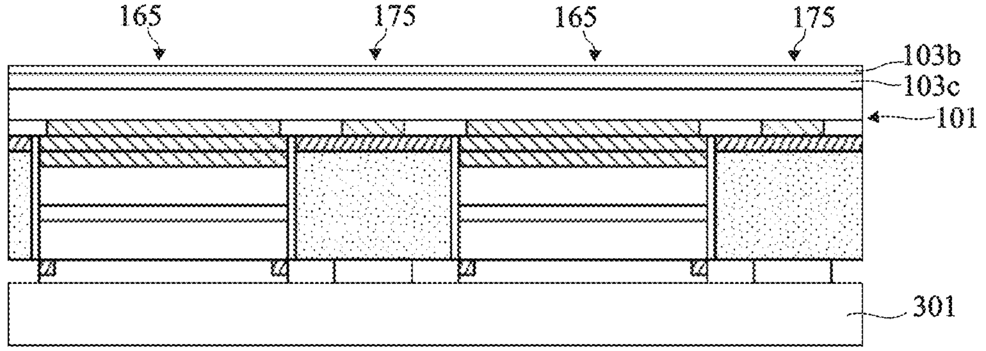

FIG. 3B illustrates a step of bonding of the structure of FIG. 3A onto a temporary support substrate 301, for example, made of silicon. The structure of FIG. 3A is bonded to support substrate 301 by its surface opposite to integrated control circuit 101, that is, by its lower surface in the orientation of FIG. 3B, corresponding to its upper surface in the orientation of FIG. 3A.

FIG. 3B further illustrates an optional step of thinning of semiconductor substrate 103, from its surface opposite to integrated control circuit 101. As an example, the components, particularly transistors, of integrated circuit 101, may be formed inside and on top of the single-crystal silicon layer 103*c* of the SOI substrate. The thinning step of FIG. 3B may comprise, as illustrated in this drawing, removing the support substrate 103*a* of SOI substrate 103, to only keep single-crystal silicon layer 103*c* and the insulating layer 103*b* of the SOI substrate.

As a variant, in a case where integrated circuit 101 is formed inside and on top of a solid silicon substrate, the thinning step may comprise decreasing the thickness of the substrate, for example, by grinding from its upper surface (in the orientation of FIG. 3B). An insulating passivation layer (not detailed in the drawing) may then be deposited on the upper surface of the thinned substrate.

Figure 3C:
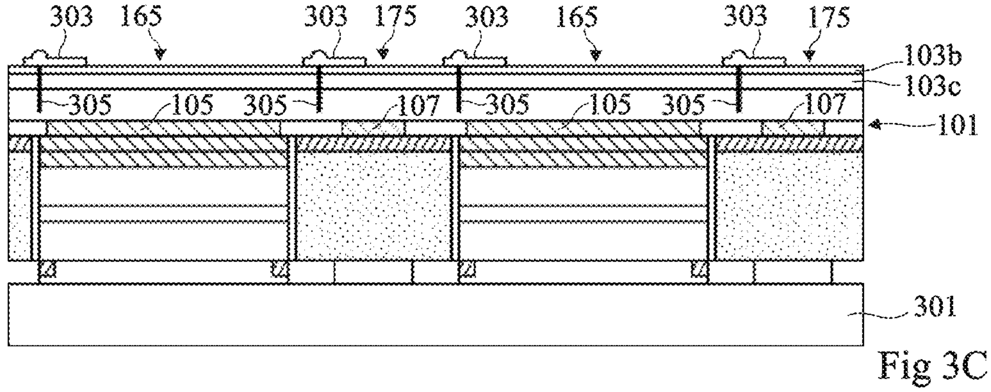

FIG. 3C illustrates subsequent steps of forming, on the upper surface side of integrated circuit 101, of metal connection pads 303, coupled to connection pads 105, 107 and/or to connection terminals of electronic components, for example, MOS transistors, of integrated circuit 101, via conductive vias 305 crossing the semiconductor substrate 103 of integrated circuit 101. Each conductive via 305 for example contacts a connection level of integrated control circuit 101.

Figure 3D:
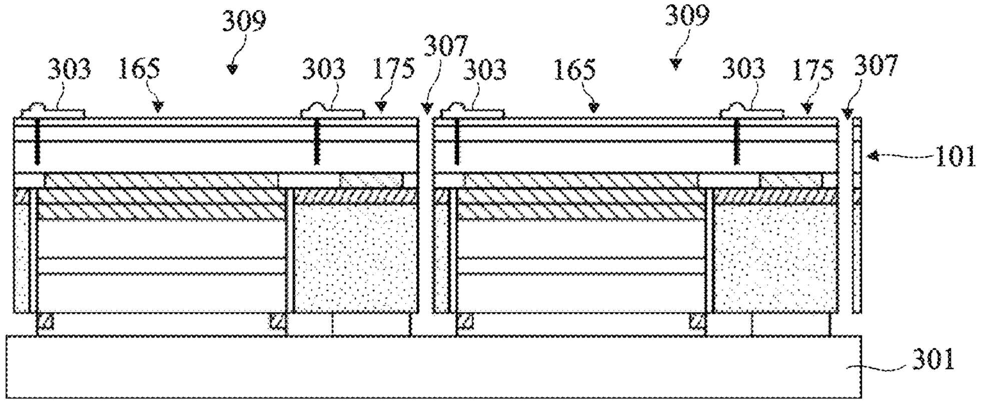

FIG. 3D illustrates a step of forming, from the upper surface of integrated circuit 101, of trenches 307 vertically crossing integrated circuit 101 and the structure having the LEDs and the photosensitive diodes formed therein, and emerging onto the upper surface of temporary support substrate 301. Trenches 307 laterally delimit a plurality of semiconductor chips 309 corresponding to the elementary chips of the pixel of the display device. Trenches 307 may be formed by plasma etching, by sawing, or by any other adapted cutting method.

Figures 3E, 3F, 3G:
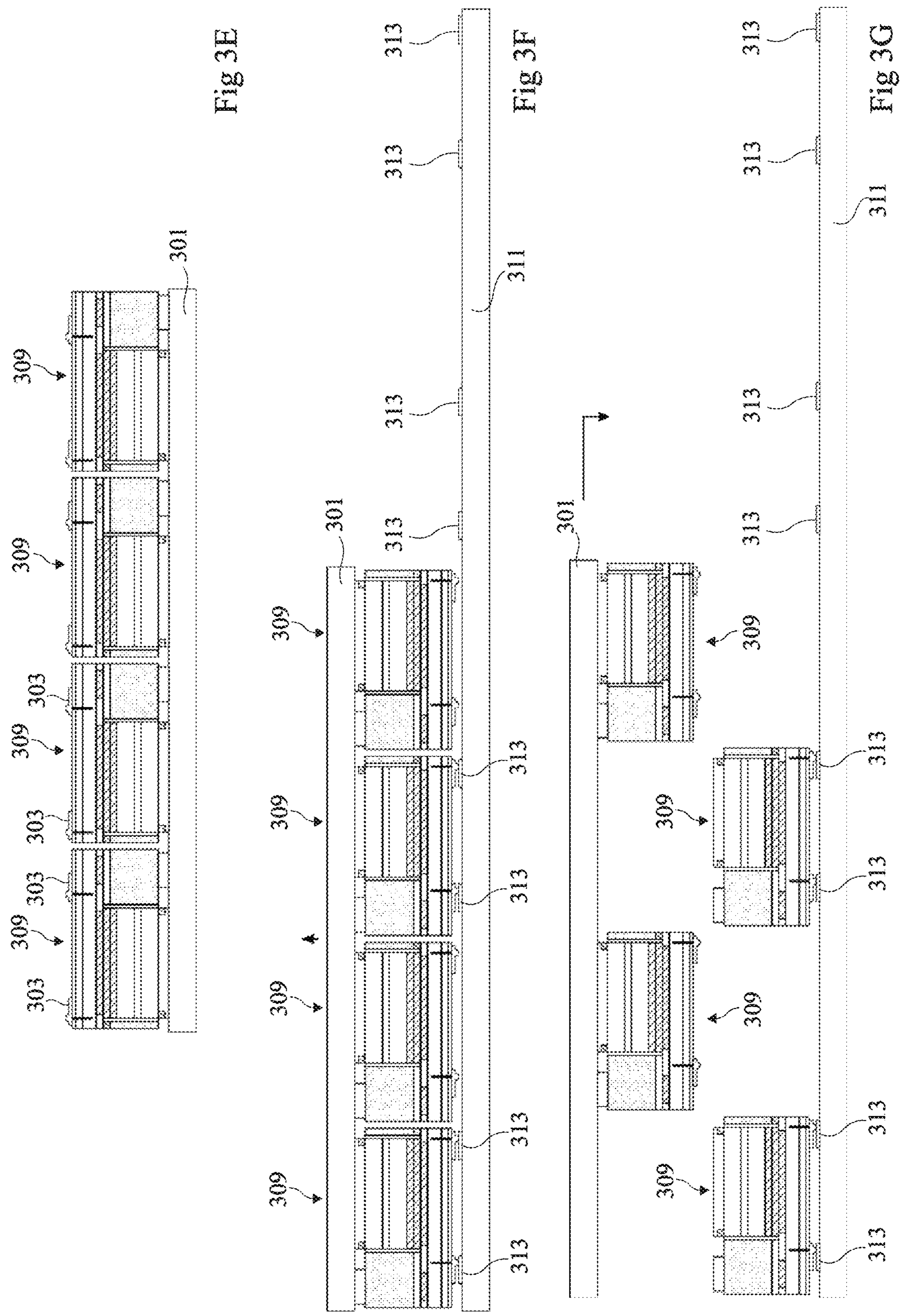

FIG. 3E illustrates a portion of the temporary support 301 having the semiconductor chips 309 bonded thereto. In the shown example, four semiconductor chips 309 are bonded to the surface of temporary support 301, it being understood that, in practice, a larger number of semiconductor chips 309 may be bonded to support 301.

FIGS. 3F and 3G illustrate a step of bonding of elementary chips 309 onto the upper surface of a same transfer substrate 311 of the display device. Transfer substrate 311 comprises, on its upper surface side, a plurality of metal connection pads 313, intended to be bonded and electrically and mechanically connected to corresponding metal connection pads 303 of elementary chips 309.

The structure of FIG. 3E is turned upside down to place the metal connection pads 303 of elementary chips 309 in front of corresponding metal connection pads 313 of transfer substrate 311. Opposite pads 303 and 313 are then bonded and electrically connected, for example, by direct bonding, by welding, by means of microtubes, or by any other adapted method.

Once bonded to transfer substrate 311 (FIG. 3F), elementary chips 309 are separated from temporary support substrate 301, and the latter is removed (FIG. 3G). As an example, the separation of chips 309 is performed by mechanical separation or by separation by means of laser beam.

In the shown example, the pitch (center-to-center distance in front view) of elementary chips 309 on transfer substrate 311 is a multiple of the pitch of elementary chips 309 on temporary support substrate 301. Thus, only part of elementary chips 309 (one out of two in the shown example) are simultaneously transferred from temporary support substrate 301 to transfer substrate 311. The other chips remain attached to temporary support substrate 301. These remaining chips may then be transferred onto another portion of transfer substrate 311. As a variant, the transfer of these remaining elementary chips may be performed onto another transfer substrate.

Various embodiments and variants have been described. Those skilled in the art will understand that certain features of these various embodiments and variants may be combined, and other variants will occur to those skilled in the art.

In particular, the described embodiments are not limited to the examples of materials and/or of dimensions mentioned in the present disclosure.

Finally, the practical implementation of the described embodiments and variants is within the abilities of those skilled in the art based on the functional indications given hereabove. In particular, the implementation of the method described in relation with FIGS. 3A to 3G starting from the structure obtained at the end of the method described in relation with FIGS. 2A to 2V is within the abilities of those skilled in the art based on the indications of the present disclosure.

The invention claimed is:

1. An optoelectronic device manufacturing method comprising the successive steps of:

a) forming, on an integrated control circuit previously formed inside and on top of a semiconductor substrate, a plurality of inorganic light-emitting diodes (LEDs); and b) depositing an organic active photosensitive semiconductor layer to totally fill all free spaces laterally extending between the plurality of inorganic light-emitting diodes;

each inorganic LED of the plurality of inorganic LEDs comprising:

an active stack comprising an emissive layer interposed between a layer made of an N-type doped semiconductor material and a layer made of a P-type doped semiconductor material, and an insulating layer located on top of and in contact with the side walls of the active stack;

and the organic active photosensitive semiconductor layer being located on top of and in contact with the insulating layer.

2. The method according to claim 1, comprising forming of a plurality of photosensitive diodes each including a portion of the organic active photosensitive semiconductor layer.

3. The method according to claim 2, comprising, after step a) and before step b), a step of forming of electrodes of the plurality of photosensitive diodes between the plurality of inorganic light-emitting diodes.

4. The method according to claim 1, wherein the organic active photosensitive semiconductor layer comprises at least one polymer material.

5. The method according to claim 1, wherein the organic active photosensitive semiconductor layer comprises quantum dots.

6. The method according to claim 1, wherein the organic active photosensitive semiconductor layer is an organic semiconductor layer.

7. The method according to claim 1, wherein the organic active photosensitive semiconductor layer is deposited by liquid deposition between the plurality of inorganic light-emitting diodes.

8. The method according to claim 1, wherein step a) comprises a step of transfer of an active inorganic light-emitting diode stack onto the integrated control circuit, and then a step of etching of trenches in the active inorganic light-emitting diode stack, to laterally separate the plurality of inorganic light-emitting diodes from one another.

9. The method according to claim 8, further comprising, after step a) and before step b), a step of anisotropic deposition of a conductive layer on top of and between the plurality of inorganic light-emitting diodes.

10. The method according to claim 1, wherein step a) comprises a step of transfer, onto the integrated control circuit, of a structure comprising, on a support substrate, the plurality of inorganic light-emitting diodes and, between the plurality of inorganic light-emitting diodes, a stack comprising, from the support substrate, a first conductive layer, an insulating layer, and a second conductive layer, the second conductive layer being flush with a surface of the plurality of inorganic light-emitting diodes opposite to the support substrate.

11. The method according to claim 10, further comprising, after the transfer step, a step of removal of the support substrate and then a step of etching of the second conductive layer, wherein the insulating layer is used as an etch stop layer.

12. The method according to claim 1, comprising, after step b), a step of bonding of a temporary support substrate on a side of a surface of the optoelectronic device opposite to the integrated control circuit, followed by a step of cutting of an assembly comprising the integrated control circuit, the organic active photosensitive layer, and the plurality of inorganic light-emitting diodes into a plurality of elementary chips.

13. The method according to claim 12, further comprising a step of transfer and of bonding of said plurality of elementary chips onto a transfer substrate of the optoelectronic device, and then a step of removal of the temporary support substrate.

14. An optoelectronic device comprising:

an integrated control circuit formed inside and on top of a semiconductor substrate;

a plurality of inorganic light-emitting diodes (LEDs) arranged on a surface of the integrated control circuit; and an organic active photosensitive semiconductor layer totally filling all free spaces laterally extending between the plurality of inorganic light-emitting diodes;

each inorganic LED of the plurality of inorganic LEDs comprising:

an active stack comprising an emissive layer interposed between a layer made of an N-type doped semiconductor material and a layer made of a P-type doped semiconductor material, and an insulating layer located on top of and in contact with the side walls of the active stack;

and the organic active photosensitive semiconductor layer being located on top of and in contact with the insulating layer.

15. An optoelectronic device comprising a transfer substrate and a plurality of elementary chips bonded and electrically connected to the transfer substrate, each elementary chip of the plurality of elementary chips comprising a an optoelectronic device according to claim 14, the integrated control circuit being arranged on a side of the transfer substrate.

* * * * *